US008581386B2

(12) United States Patent
Yen et al.

(10) Patent No.: US 8,581,386 B2
(45) Date of Patent: Nov. 12, 2013

(54) CHIP PACKAGE

(76) Inventors: Yu-Lin Yen, Taipei (TW); Shih-Ming Chen, Hsinchu (TW); Hsi-Chien Lin, Zhubei (TW); Yu-Lung Huang, Daxi Township (TW); Tsang-Yu Liu, Zhubei (TW)

( * ) Notice: Subject to any disclaimer, the term of this patent is extended or adjusted under 35 U.S.C. 154(b) by 0 days.

(21) Appl. No.: 13/350,690

(22) Filed: Jan. 13, 2012

(65) Prior Publication Data

US 2012/0112329 A1 May 10, 2012

Related U.S. Application Data

(63) Continuation-in-part of application No. 13/035,861, filed on Feb. 25, 2011.

(60) Provisional application No. 61/308,855, filed on Feb. 26, 2010.

(51) Int. Cl.
*H01L 23/04* (2006.01)
*H01L 23/12* (2006.01)

(52) U.S. Cl.
USPC ............................ 257/698; 257/730; 257/773

(58) Field of Classification Search
USPC ......................................... 257/698, 730, 773
See application file for complete search history.

(56) References Cited

U.S. PATENT DOCUMENTS 8,125,042 B2 * 2/2012 Kim et al. ..................... 257/434
2006/0180887 A1 * 8/2006 Ono .............................. 257/432
2009/0294779 A1 * 12/2009 Ida et al. ......................... 257/82

* cited by examiner

*Primary Examiner* — Ngan Ngo
(74) *Attorney, Agent, or Firm* — Liu & Liu

(57) ABSTRACT

An embodiment of the invention provides a chip package, which includes: a semiconductor substrate having a device region and a non-device region neighboring the device region; a package layer disposed on the semiconductor substrate; a spacing layer disposed between the semiconductor substrate and the package layer and surrounding the device region and the non-device region; a ring structure disposed between the semiconductor substrate and the package layer, and between the spacing layer and the device region, and surrounding a portion of the non-device region; and an auxiliary pattern including a hollow pattern formed in the spacing layer or the ring structure, a material pattern located between the spacing layer and the device region, or combinations thereof.

20 Claims, 30 Drawing Sheets

2400
114
110
112
103
101
100
102
124
118
128
111A
2410
2412
2401
2401A
2401B
120
122
126
106
104

CHIP PACKAGE

CROSS REFERENCE TO RELATED APPLICATIONS

This application is a Continuation-In-Part of pending U.S. patent application Ser. No. 13/035,861, filed Feb. 25, 2011 and entitled "CHIP PACKAGE AND FABRICATION METHOD THEREOF", which claims the benefit of U.S. Provisional Application No. 61/308,855, filed Feb. 26, 2010, the entirety of which is incorporated by reference herein.

BACKGROUND OF THE INVENTION

1. Field of the Invention

The present invention relates to chip package technology, and in particular relates to a chip package and fabrication method thereof.

2. Description of the Related Art

A wafer level packaging technology for a chip package has been developed. A semiconductor wafer is usually bonded to a glass substrate with a spacing layer therebetween. After the wafer level packaging process is completed, a dicing process is performed between chips to form separated chip packages.

The CTE (coefficient of thermal expansion) mismatch between the semiconductor substrate, the spacing layer and the glass substrate causes reliability problems or even delamination of the chip package as the spacing layer cannot tightly adhere to the semiconductor substrate and/or the glass substrate. As a result, moisture or air may enter into the chip package, adversely affecting electrical performance thereof.

Hence, it is desirable to provide a chip package which can overcome the problems described above to improve the reliability of the chip package.

BRIEF SUMMARY OF THE INVENTION

An embodiment of the invention provides a chip package, which includes: a semiconductor substrate having a device region and a non-device region neighboring the device region; a package layer disposed on the semiconductor substrate; a spacing layer disposed between the semiconductor substrate and the package layer and surrounding the device region and the non-device region; a ring structure disposed between the semiconductor substrate and the package layer, and between the spacing layer and the device region, and surrounding a portion of the non-device region; and an auxiliary pattern comprising a hollow pattern formed in the spacing layer or the ring structure, a material pattern located between the spacing layer and the device region, or combinations thereof.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
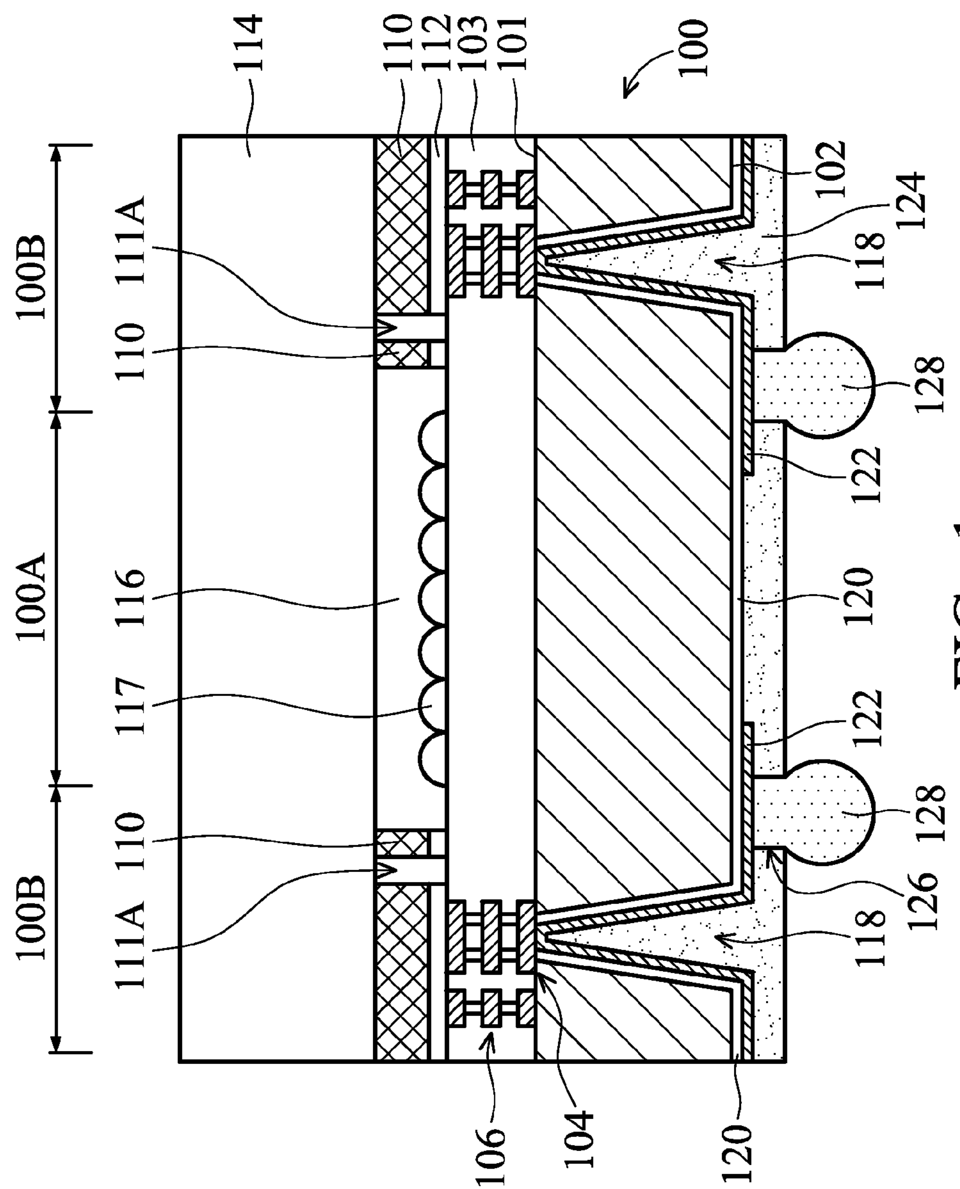
FIGS. 1-7 show chip packages according to various embodiments of the present invention.

The present invention will be illustrated in detail with references made to the accompanying drawings. In the drawings or the description, similar or same reference numerals are used to designate similar or same elements. In addition, shapes or thickness of embodiments shown in the drawings may be exaggerated for simplicity or the convenience of labeling. Further, each element shown in the drawings will be described. It should be noted that any element not shown or described may be any kind of conventional element as known by those skilled in the art. In addition, the disclosed embodiment is merely a specific example for practicing the invention, without acting as a limitation upon its scope.

In the embodiments of the present invention, a method of fabricating an image sensor package is used as an example. That is, it should be appreciated that the chip package of the embodiments of the invention may be applied to electronic components with active or passive devices, or digital or analog circuits, such as opto electronic devices, micro-electro-mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

In the embodiments of the present invention, an auxiliary pattern is used to decrease the stress between the spacing layer and the semiconductor substrate/the glass substrate and/or to increase the support for the cavity. The preferable embodiments of the present invention will be described below in detail with reference to FIG. 1 to FIG. 14.

Referring to FIG. 1, a cross-sectional view of a chip package of an embodiment of the present invention is shown. A semiconductor substrate 100 is formed, for example, by cutting a semiconductor wafer including chips. The semiconductor substrate 100 has a device region 100A and a periphery bonding pad region 100B surrounding the device region 100A. The device region 100A has semiconductor devices, such as image sensor devices or microelectro mechanical structures. In the present embodiment, a micro lens array 117 is formed on the device region 100A to direct light onto the image sensor devices. In this case, the device region 100A can be regarded as an image sensing region.

Conductive pads 104 and seal rings 106 are disposed on the periphery bonding pad region 100B of the semiconductor substrate 100. The conductive pads 104 are, for example, bonding pads, which connect to the interior of the chip through metal traces (not shown). The seal rings 106 are located on the outermost rim of the chip to prevent the cracks of the semiconductor wafer from penetrating into the chip during the dicing process, wherein the seal rings 106 are electrically insulated from the interior of the chip.

A back surface 102 of the semiconductor substrate 100 has a through hole 118 exposing the conductive pad 104. An insulating layer 120 is disposed on the back surface 102 of the semiconductor substrate and extends to a sidewall of the through hole 118. A conductive trace layer 122 is disposed on the insulating layer 120 and extends to a bottom of the trough hole 118 so as to electrically connect to the conductive pad 104. A passivation layer 124 covers the conductive trace layer 122 and the insulating layer 120 and has an opening 126 exposing a portion of the conductive trace layer 122. A conductive bump 128 is disposed in the opening 126 of the passivation layer 124 so as to electrically connect to the conductive trace layer 122.

A front surface 101 of the semiconductor substrate 100 is bonded to a package layer 114, and a spacing layer 110 is disposed therebetween. The spacing layer 110 surrounds the device region 100A so as to define a cavity 116 between the semiconductor substrate 100 and the package layer 114. The package layer 114 may be a transparent substrate, such as a glass substrate, a quartz substrate, an opal substrate, a plastic substrate or any other transparent substrate allowing light to pass therethrough. Filters and/or anti-reflective layers may be optionally formed on the package layer 114. In embodiments of non-photosensitive device chips, the package layer 114 may be a semiconductor material layer, such as a silicon covering layer.

In the present embodiment, the spacing layer 110 is firstly formed on the package layer 114, and bonded to the semiconductor substrate 100 through an adhesive layer 112 such that the adhesive layer 112 is between the spacing layer 110 and the semiconductor substrate 100. In another embodiment, the spacing layer 110 is firstly formed on the semiconductor substrate 100, and bonded to the package layer 114 through an adhesive layer such that the adhesive layer is between the spacing layer 110 and the package layer 114. In the other embodiment, the spacing layer 110 is directly bonded to the semiconductor wafer 100 and the package layer 114 without using the adhesive layer.

Figure 2:
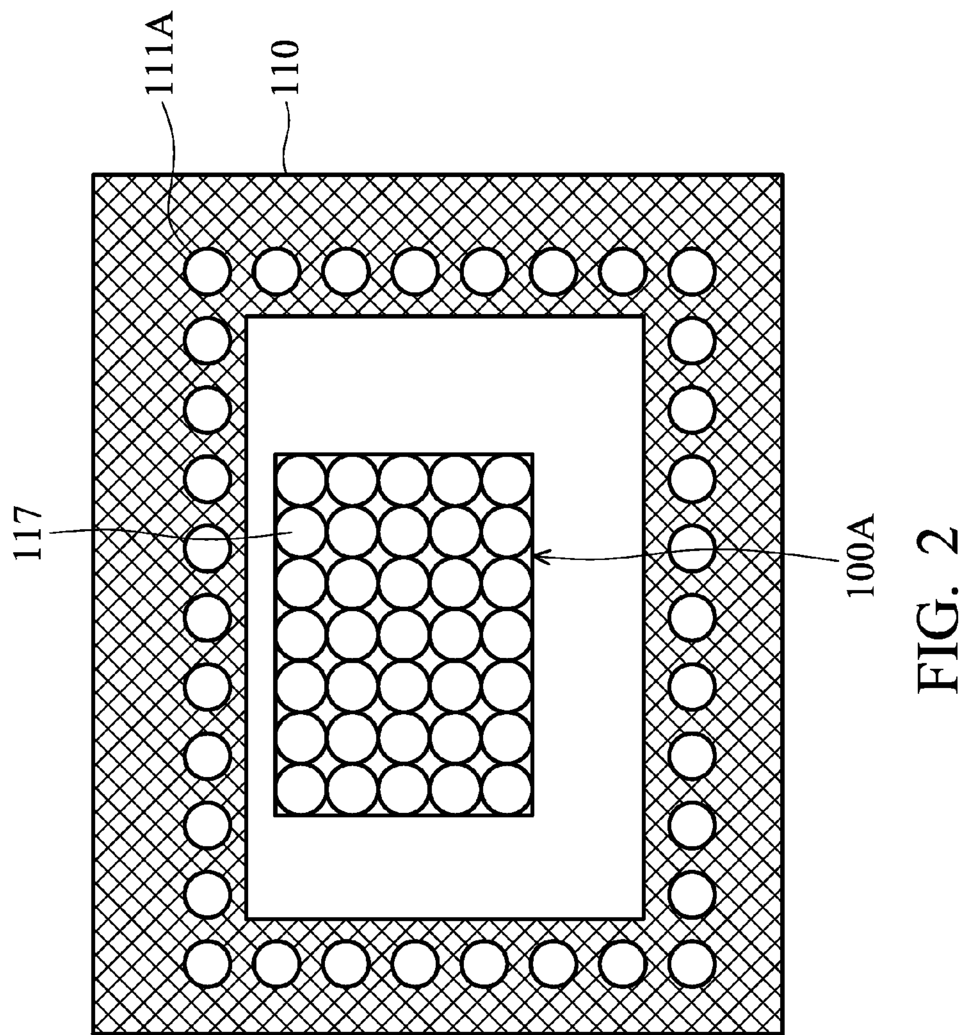

In the present invention, an additional auxiliary pattern between the package layer 114 and the semiconductor substrate 100 is designed to improve the reliability of the chip package. In one embodiment, the auxiliary pattern is a hollow pattern 111A formed in the spacing layer 110 (the top view thereof is shown in FIG. 2). The hollow pattern 111A may help release the stress between the spacing layer and the substrate/the package layer so as to improve the reliability of the chip package. Also, a compressive force must be applied to the package during the bonding process. If the applied compressive force is not enough, voids may exist on the boundary between the spacing layer and the substrate/the package layer, which would result in poor reliability of the package. The hollow pattern may decrease the surface area of the spacing layer and therefore increase the pressure to the spacing layer by a fixed compressive force, such that the spacing layer material may be tightly bonded to the substrate/the package layer so as to improve the yield of the chip package process and the reliability of the package. It should be noted that, although the hollow pattern 111A as shown in FIG. 2 is a circular opening, the present invention is not limited thereto. In the present invention, the hollow pattern may further be in other shapes, such as a semi-circular shape, elliptical shape, triangular shape, square shape, rectangular shape, polygonal shape, or combinations thereof. Also, the hollow pattern may be asymmetrically arranged in the spacing layer. In one embodiment using an adhesive layer, at least a portion of the adhesive layer 112 is filled in the hollow pattern 111A.

Figure 3:
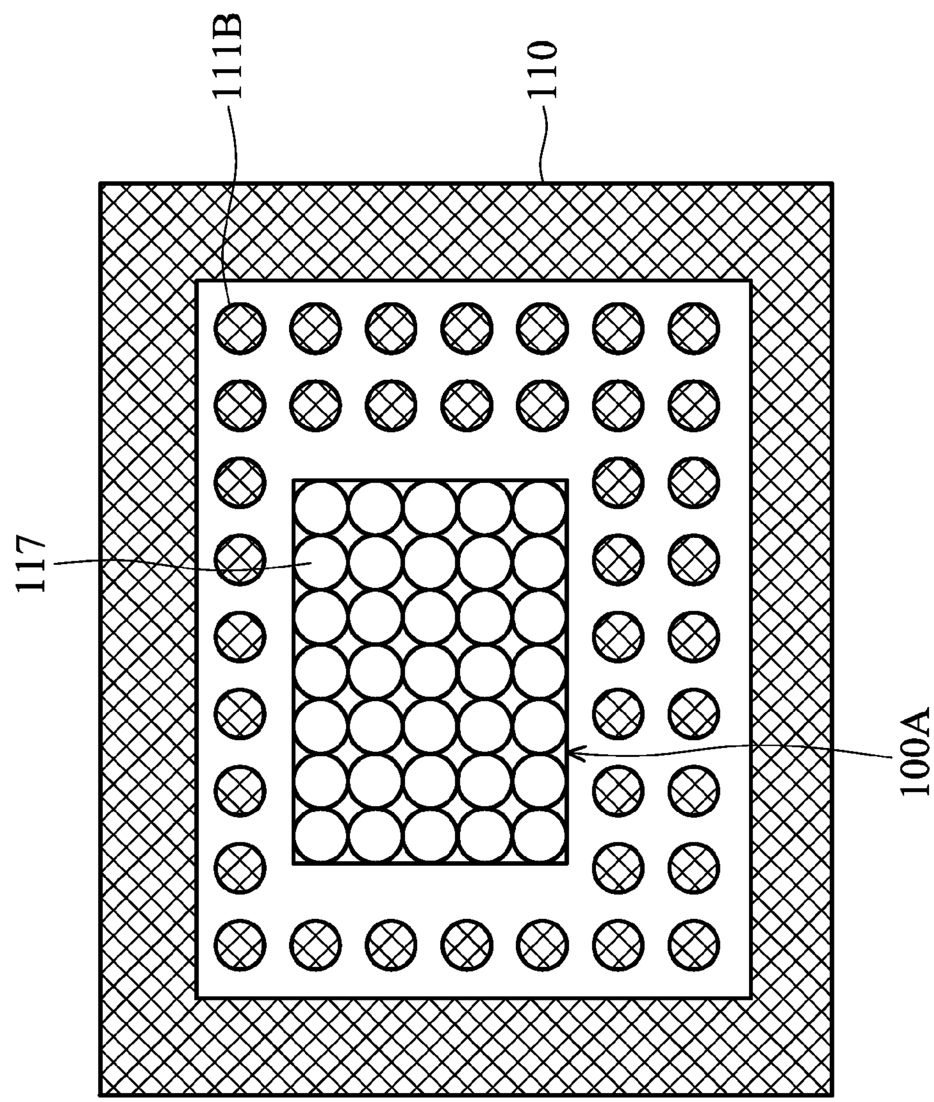
Figure 4:
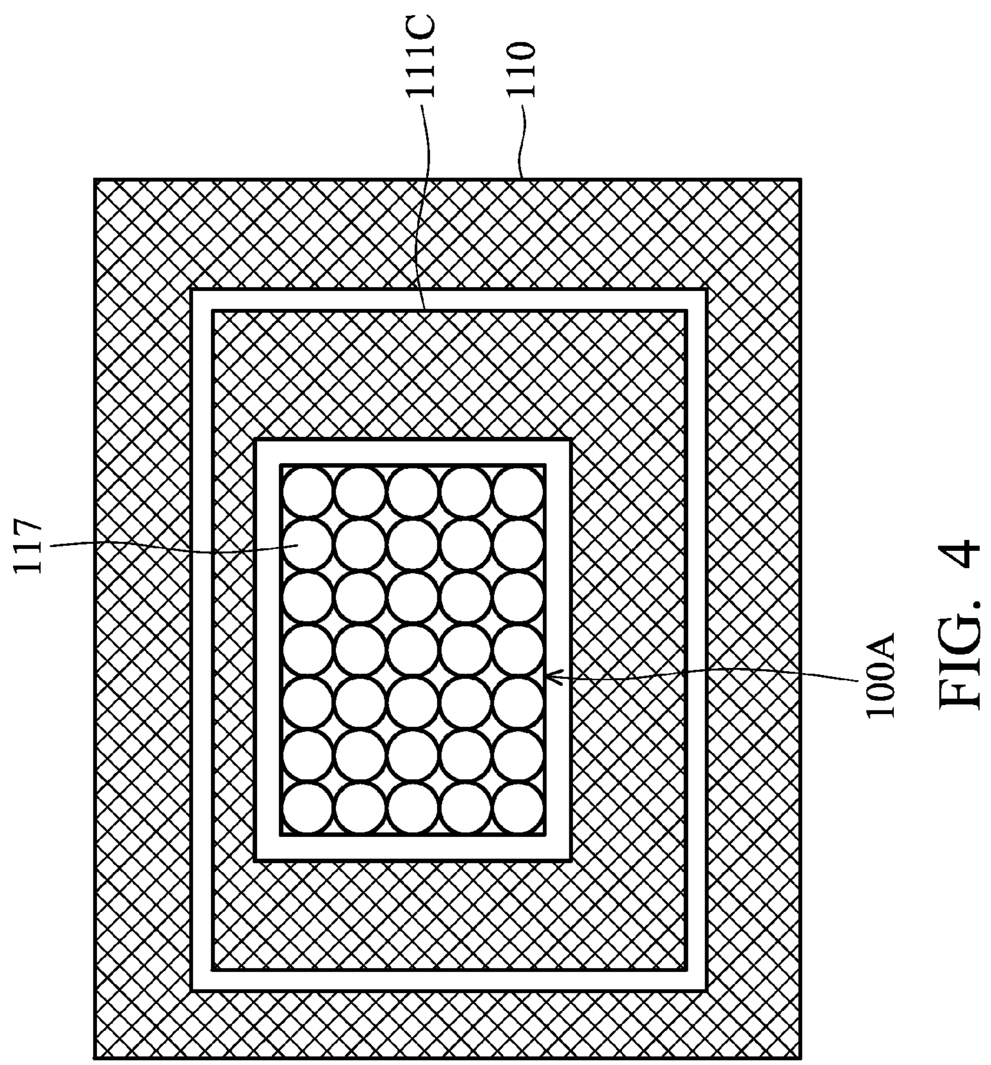
Figure 5:
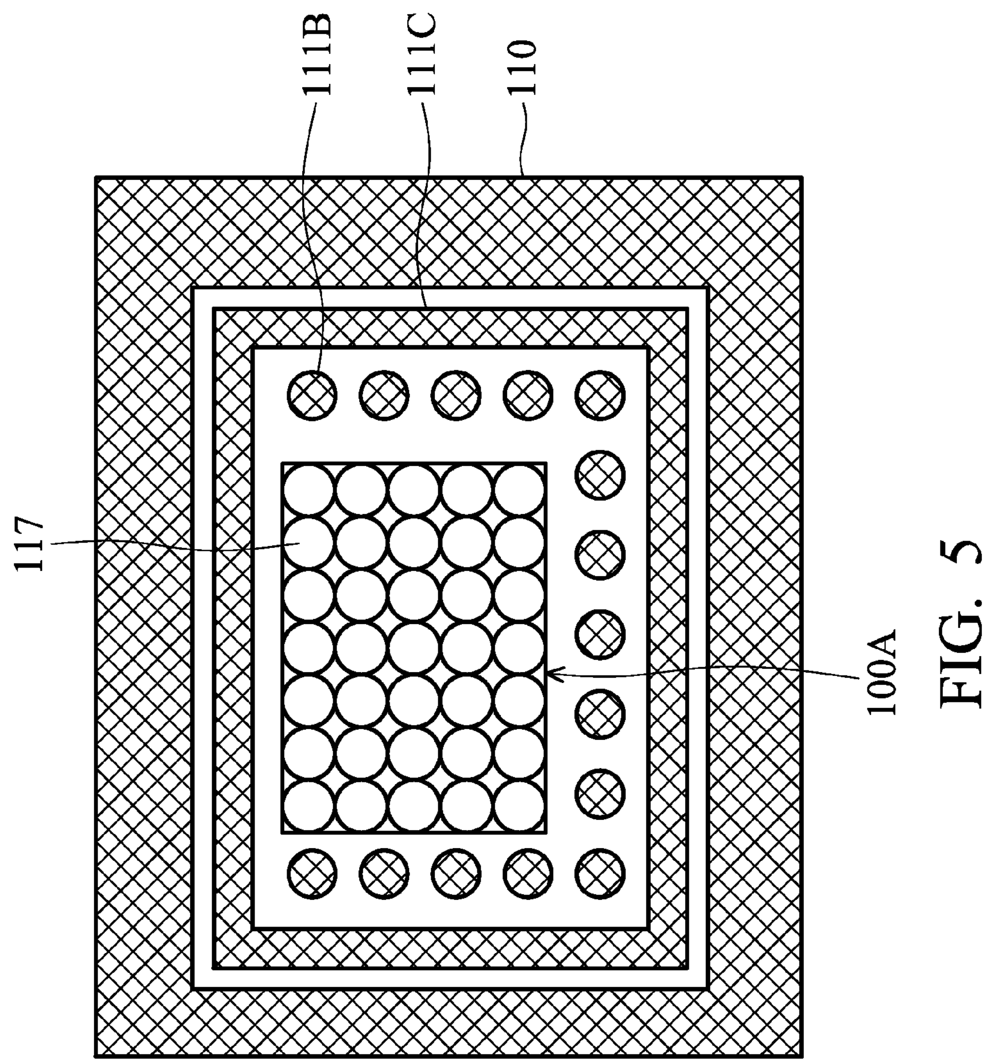
Figure 6:
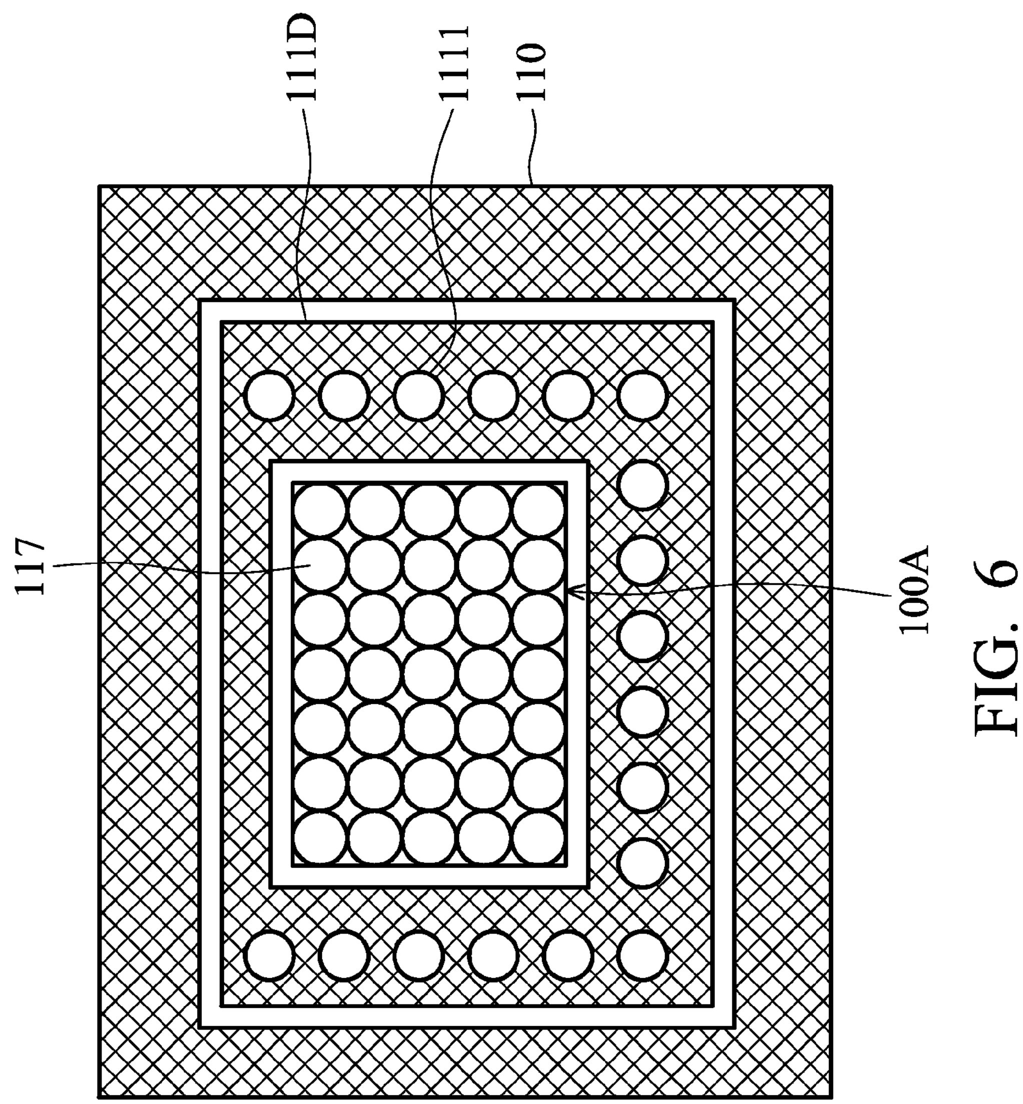

FIGS. 3~6 further show top views of chip packages of other embodiments of the present invention. The auxiliary pattern of the present invention may also be a material pattern between the spacing layer 110 and the device region 100A. In the present invention, the term “spacing layer” may refer to a single continuous structure surrounding the outermost portion of the device region, and the term “material pattern” may refer to either a solid pattern or a non-solid pattern between the spacing layer and the device region. In FIG. 3, the material pattern 111B is formed of pillars separated from each other. In FIG. 4, the material pattern 111C is a continuous pattern surrounding the device region 100A. In FIG. 5, the auxiliary pattern includes both the material pattern 111B formed of the pillars and the continuous pattern 111C surrounding the device region 100A. In FIG. 6, the auxiliary pattern 111D is a continuous pattern having a hollow structure 1111. The material pattern and the spacing layer described above are formed of the same material.

The material pattern described above may provide the package layer with an additional supporting force to achieve a wafer-level package of large-sized chips (>7×7 mm). Also, the material pattern may provide an additional supporting force during the thinning process of the semiconductor wafer to decrease the thickness of the semiconductor substrate. Further, the material pattern beside the device region may also be a masking layer to reduce the noise of image sensor devices in the device region.

It should be noted that, although the material pattern 111B as shown in FIG. 3 is formed of the pillars in circular shapes, the present invention is not limited thereto. On the contrary, the material pattern of the present invention may also be in other shapes, such as a semi-circular shape, elliptical shape, triangular shape, square shape, rectangular shape, polygonal shape, or combinations thereof. Also, the device region may not exactly be on the center of the cavity (as shown in FIG. 3), and the material pattern described above may be arranged in an asymmetric way with respect to the device region. For example, in FIG. 3, the material pattern 111B has a higher pattern density at the wider region (i.e. the right side of the device region 100A) and has a lower pattern density at the narrower region (i.e. the left side of the device region 100A).

Figure 7:
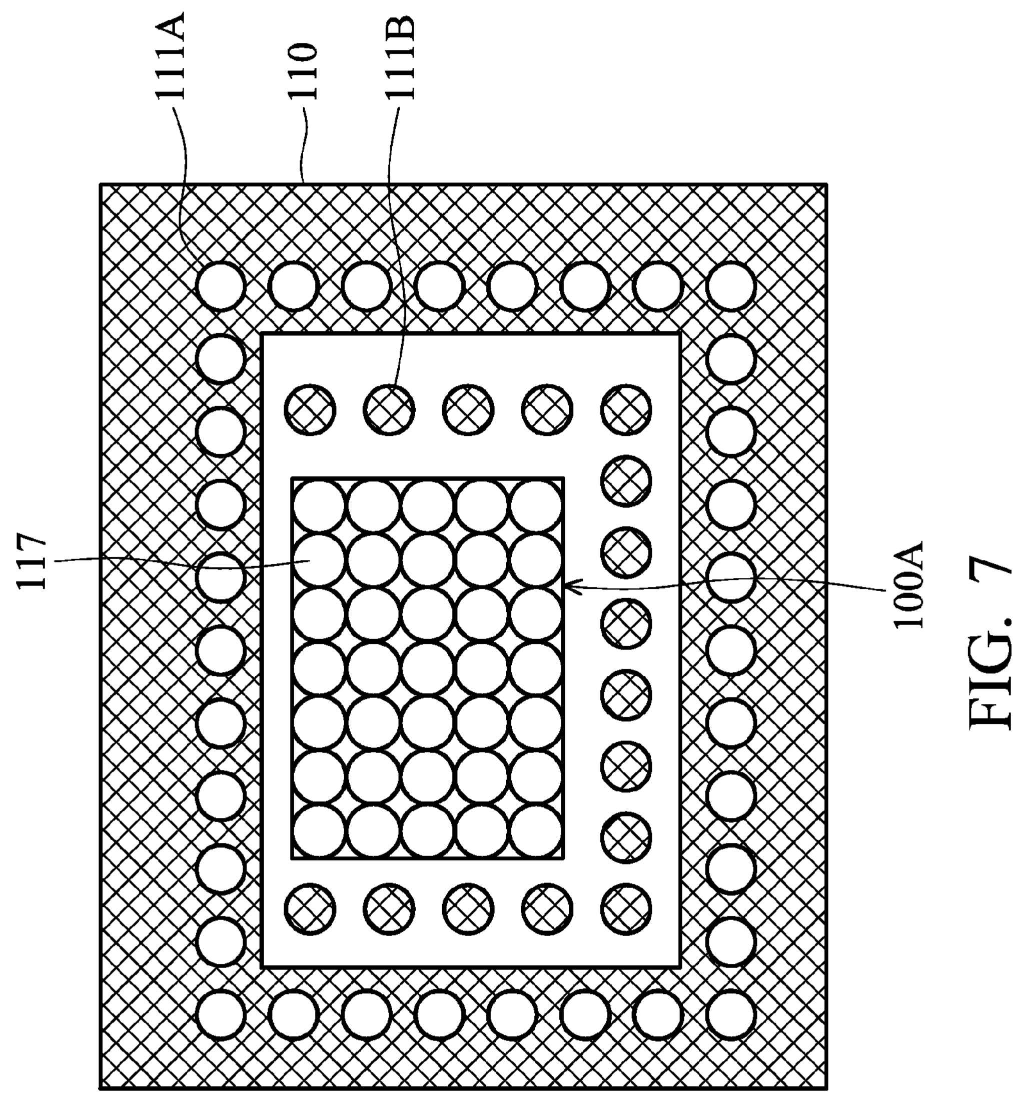

FIG. 7 shows a chip package of another embodiment of the present invention, wherein the auxiliary pattern of the chip package includes both the hollow pattern 111A formed in the spacing layer 110 and the material pattern 111B between the spacing layer 110 and the device region 100A.

According to another embodiment of the present invention, the auxiliary pattern may also be arranged on scribe lines. In this case, the auxiliary pattern is not shown in the separated chip packages after the dicing process. Such an embodiment will be described in detail in the fabrication method below.

Figure 8:
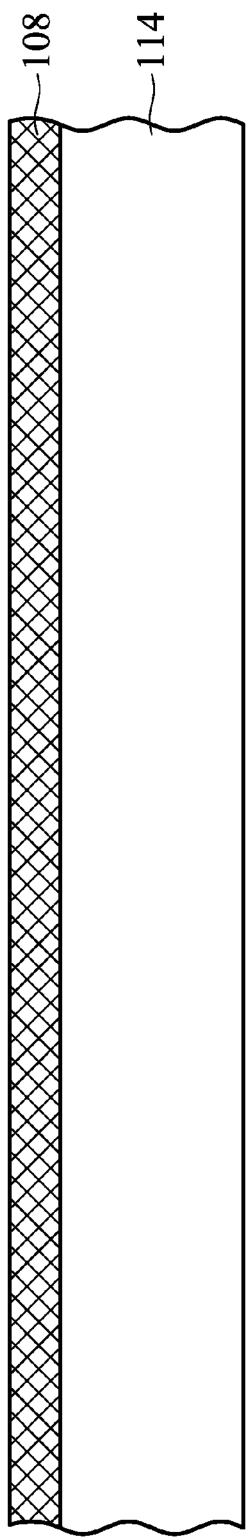
FIGS. 8-12 are a series of cross-sectional views illustrating the steps of forming a chip package in accordance with an embodiment of the present invention.

Referring to FIG. 8, according to a fabrication method of the embodiment of the present invention, a package layer 114 is firstly provided, and a spacing material coating 108 is formed on the package layer 114. The package layer 114 is, for example, a glass substrate or the other blank silicon wafer. The spacing material coating 108 may be a photosensitive insulating material (such as epoxy materials, solder mask materials, etc.) formed by any suitable coating method.

Figure 9:
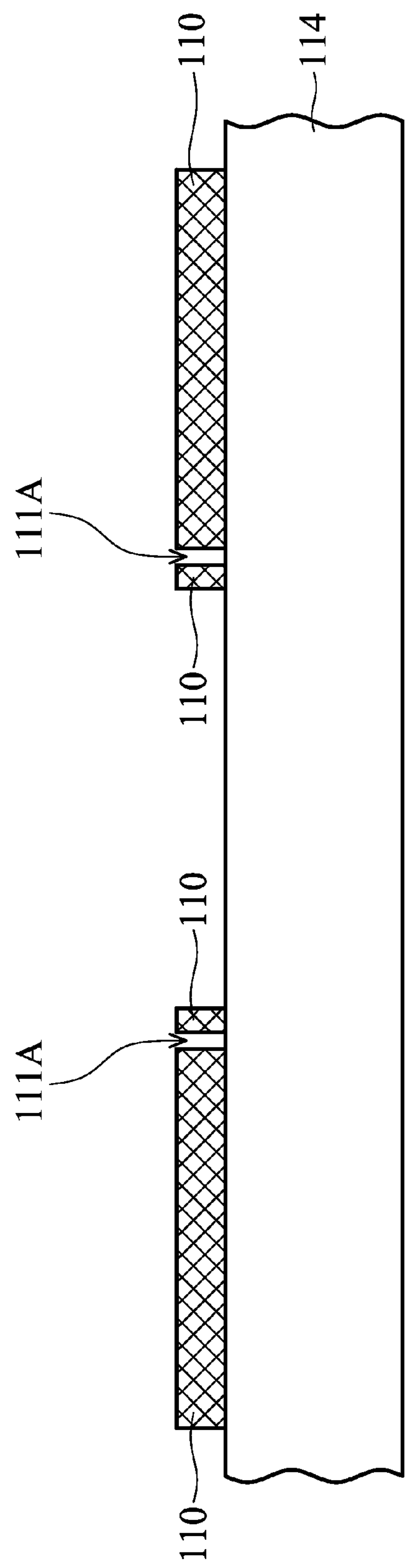

Referring to FIG. 9, the spacing material coating 108 is patterned to form a spacing layer 110 and an auxiliary pattern. The step of the patterning process may include an exposing process and a developing process. Although the auxiliary pattern is the hollow pattern 111A, by way of example, those skilled in the art will appreciate that other kinds of auxiliary patterns may be formed in the same manner.

Figure 10:
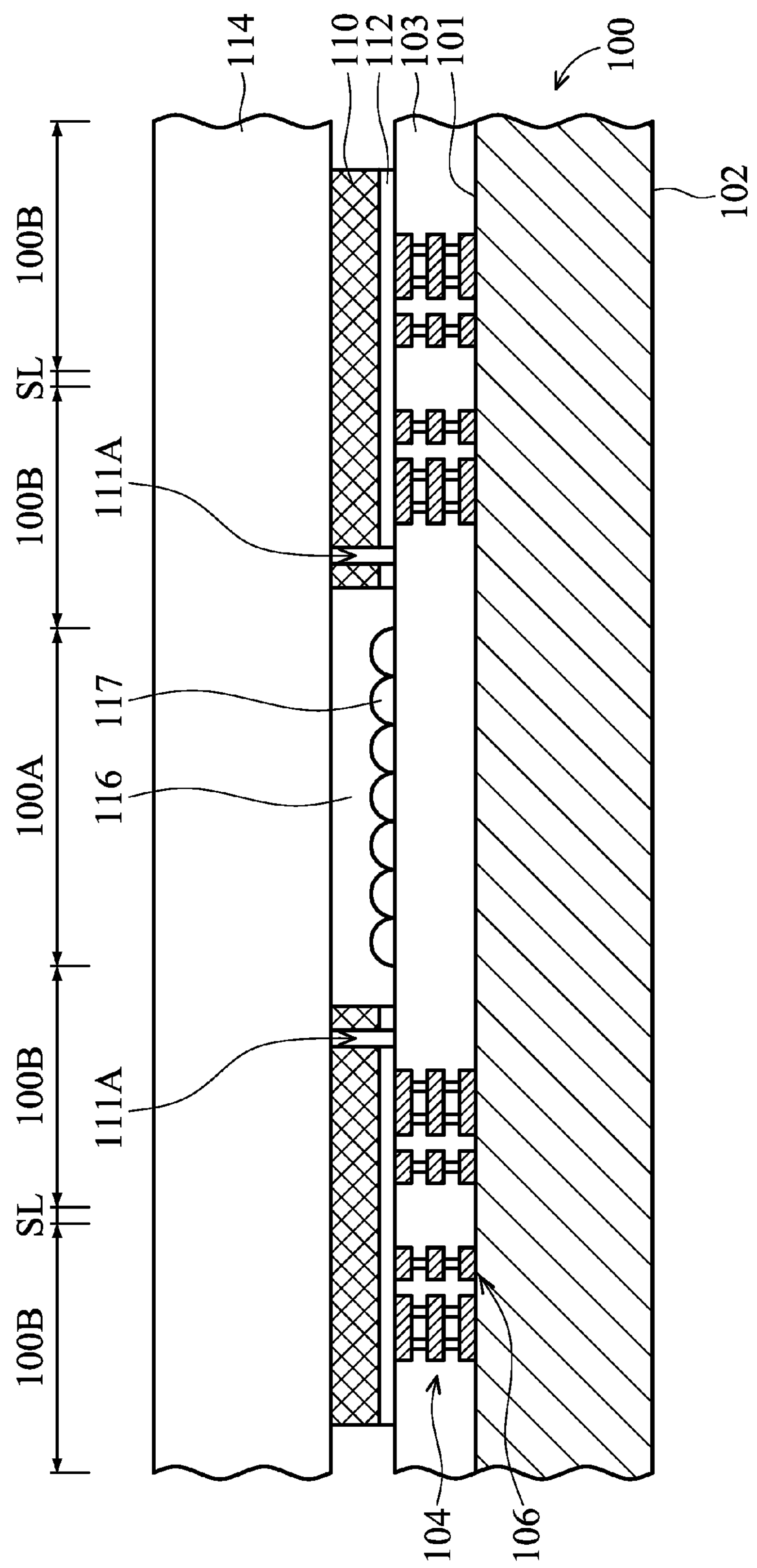

Then, as shown in FIG. 10, the package layer 114 with the auxiliary pattern and the spacing layer is bonded to a semiconductor wafer 100, and the spacing layer 110 separates the package layer 114 from the semiconductor wafer 100. At the same time a cavity 116 surrounded by the spacing layer 110 is formed. As described above, in the present embodiment, the spacing layer 110 is firstly formed on the package layer 114 and bonded to the semiconductor substrate 100 through an adhesive layer 112. In other embodiments, the spacing layer 110 may also be firstly formed on the semiconductor substrate 100 and bonded to the package layer 114 through an adhesive layer, or not using the adhesive layer. The adhesive layer described above is coated on the spacing layer 110 by screen printing, wherein the pattern of the adhesive layer is substantially the same with the pattern of the spacing layer 110.

The semiconductor wafer 100 including a plurality of chips is, in general, a silicon wafer and has a front surface 101 and a back surface 102. The semiconductor wafer 100 is defined into a device region 100A and a periphery bonding pad region 100B surrounding the device region 100A. The device region 100A has semiconductor devices, such as image sensor devices or microelectro mechanical structures. In the present embodiment, a micro lens array 117 is formed on the device region 100A to direct light onto the image sensor devices. In this case, the device region 100A can be regarded as an image sensing region.

The semiconductor wafer 100 further has conductive pads 104 and seal rings 106, which are on the periphery bonding pad region 100B. The conductive pads 104 and the seal rings 106 are formed of metal layers and vias, which are formed in an inter-metal dielectric (IMD) layer 103. The seal rings 106 surround the conductive pads 104 and the device region 100A. A scribe line SL is defined between any two neighboring seal rings 106.

Figure 11:
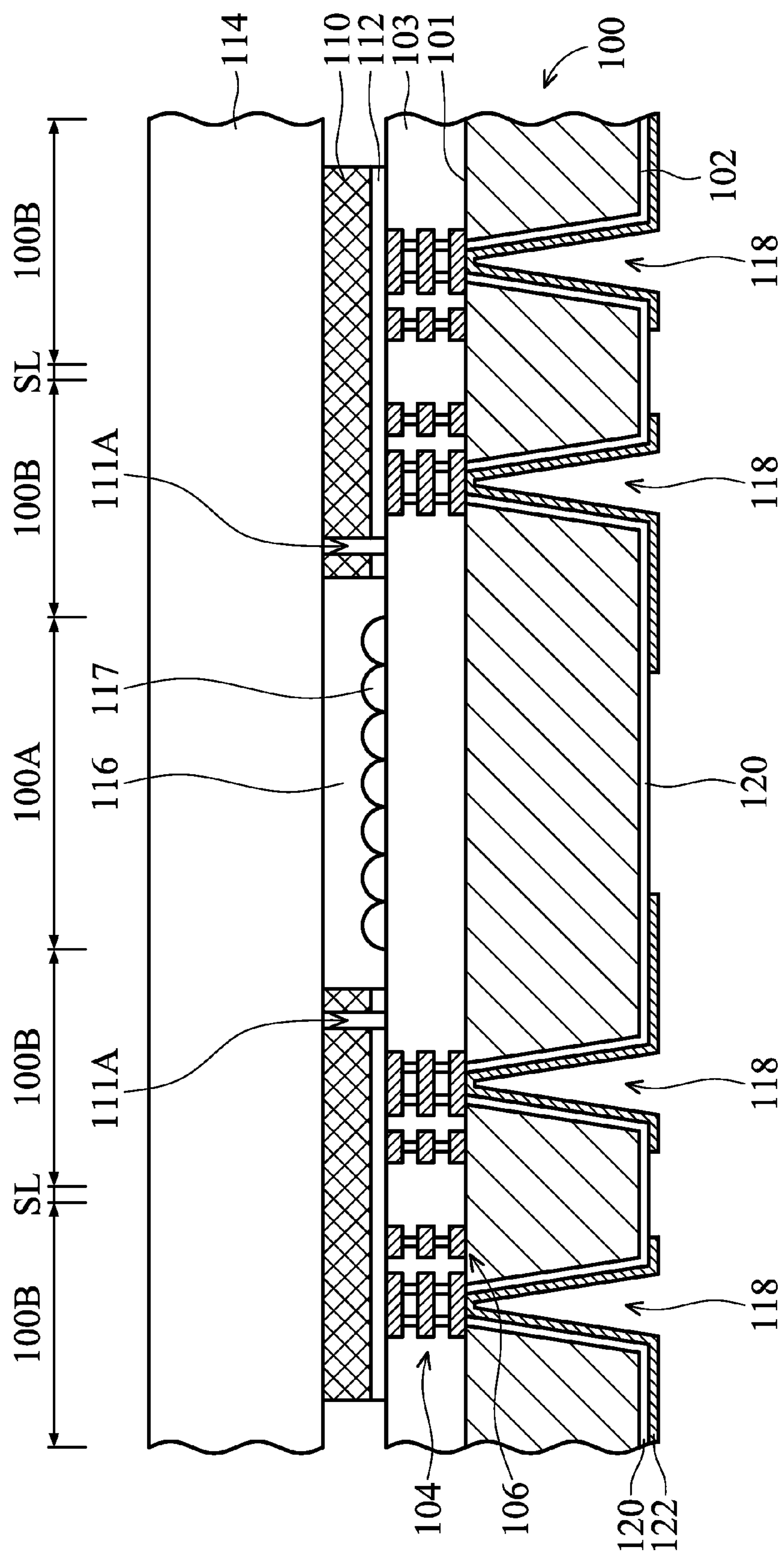

Then, referring to FIG. 11, the through holes 118 are formed on the back surface 102 of the semiconductor wafer 100 to expose the conductive pads 104. Before forming the through holes, the wafer may be thinned from the back surface by grinding, etching, etc. The through holes 118 may be formed by photolithography and etching processes or laser drilling. Then, an insulating layer 120 is formed on the back surface of the semiconductor wafer 100 and the sidewalls of the through holes 118. The insulating layer 120 may be formed of a non-photosensitive insulating material, such as a silicon oxide, silicon nitride or silicon oxynitride material. The insulating material is conformally formed on the back surface, the sidewalls and the bottoms of the through holes 118 of the semiconductor wafer by using thermal oxidation, chemical vapor deposition or physical vapor deposition. Then, the portion of the insulating layer on the bottoms of the through holes 118 is removed by photolithography and etching processes to form the insulating layer 120 as shown in FIG. 11.

Then, a conductive trace layer 122 is formed on the insulating layer 120 and extended to the bottoms of the through holes 118 to electrically connect to the conductive pads 104. A conductive material layer formed of, for example, copper, aluminum, or nickel is deposited on the insulating layer 120 and in the through holes 118 by, for example, a sputtering, evaporating or electroplating process. Then, the conductive material layer is patterned by photolithography and etching processes to form the conductive trace layer 122 as described above.

Figure 12:
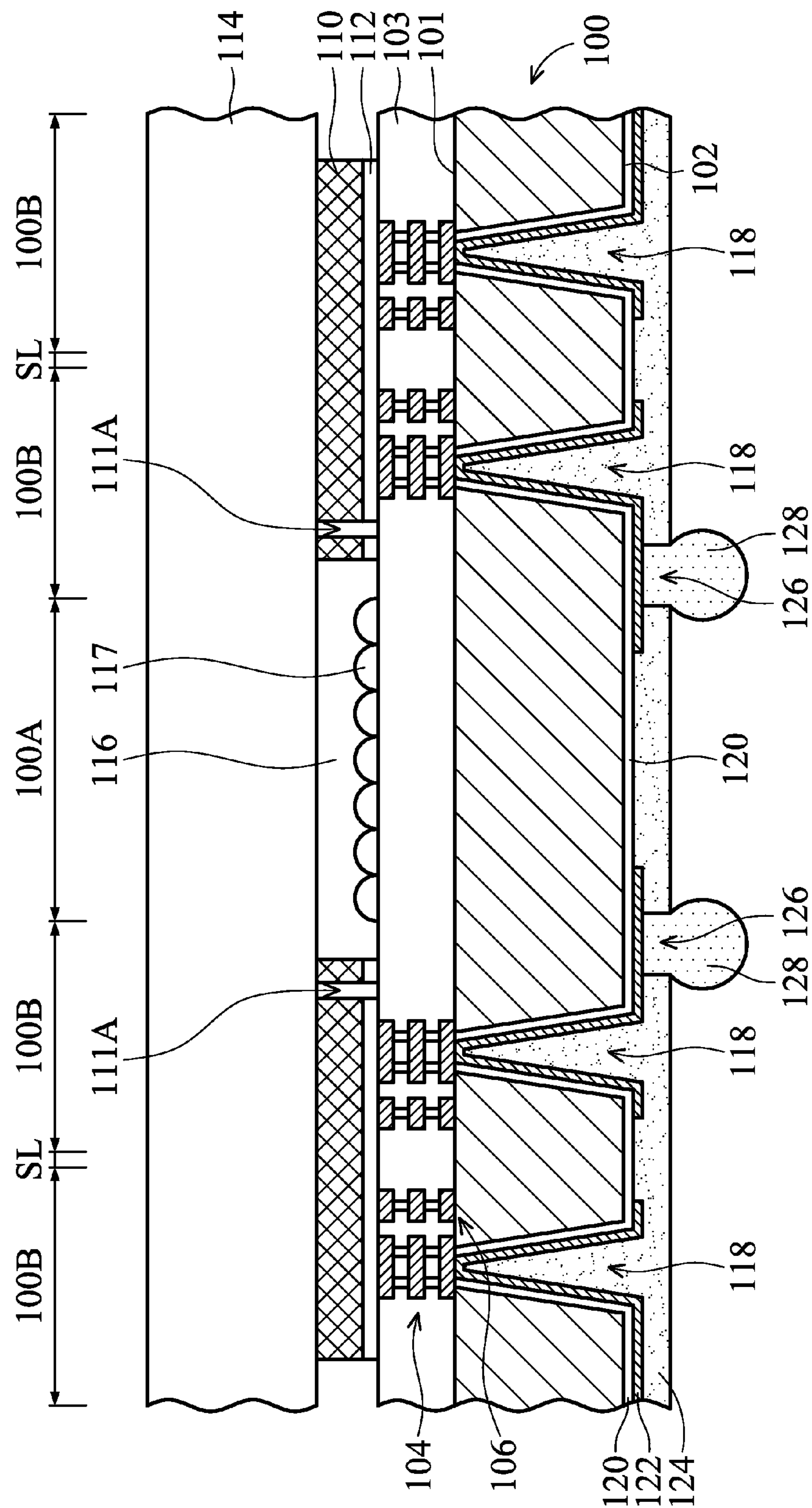

As shown in FIG. 12, a passivation layer 124 (such as a solder mask) is coated on the insulating layer 120 and the conductive trace layer 122 to cover the conductive trace layer 122. Then, the passivation layer 124 is patterned to form openings 126 so as to expose a portion of the conductive trace layer 122. Then, a solder is coated in the openings 126 of the passivation layer 124, and a reflow process is performed on the solder to form conductive bumps 128, which may be solder balls or solder paste.

Then, the semiconductor wafer 100 is cut along the scribe lines SL by using dicing blades to form chip packages as shown in FIG. 1.

Figure 13:
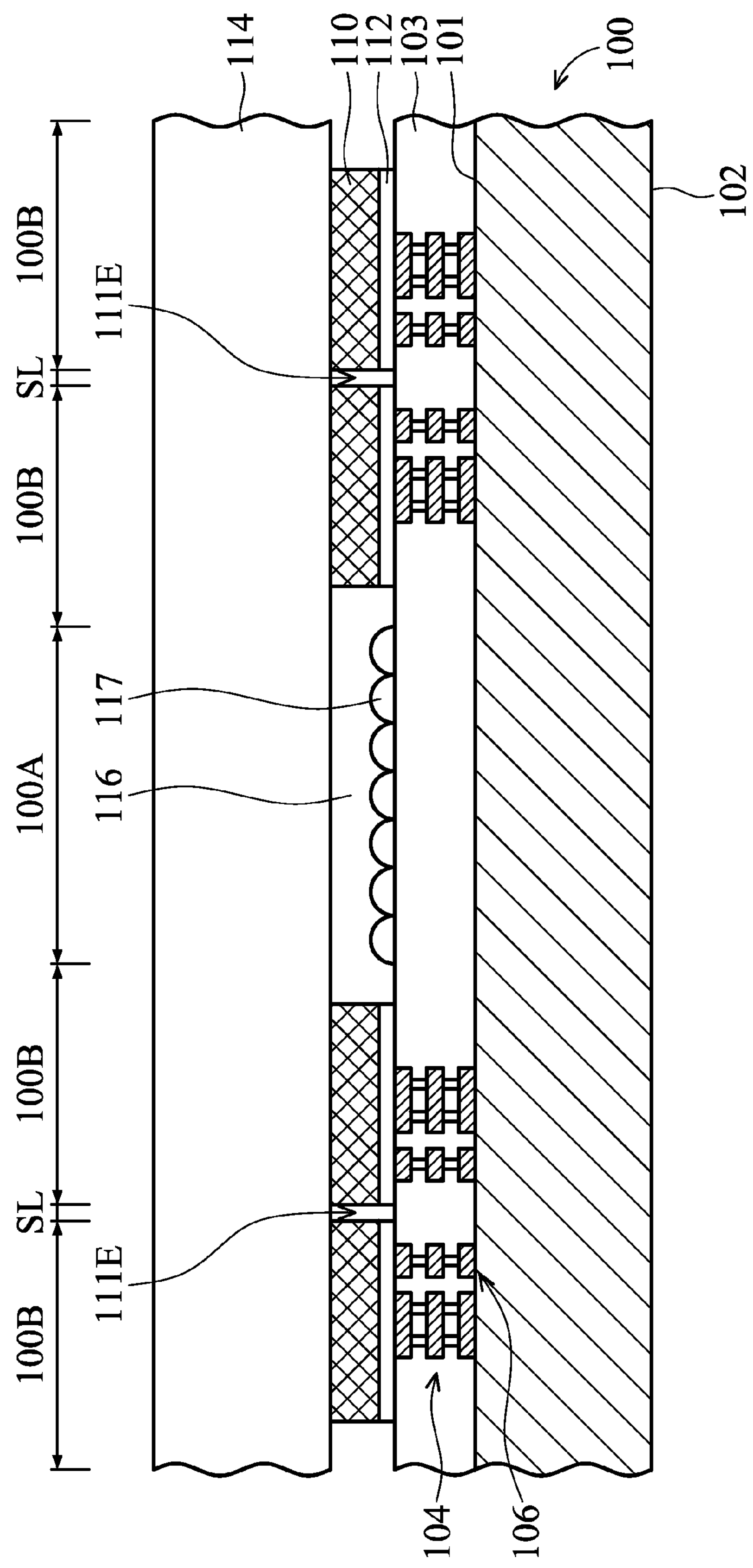
FIGS. 13-14 show a chip package according to another embodiment of the present invention.
Figure 14:
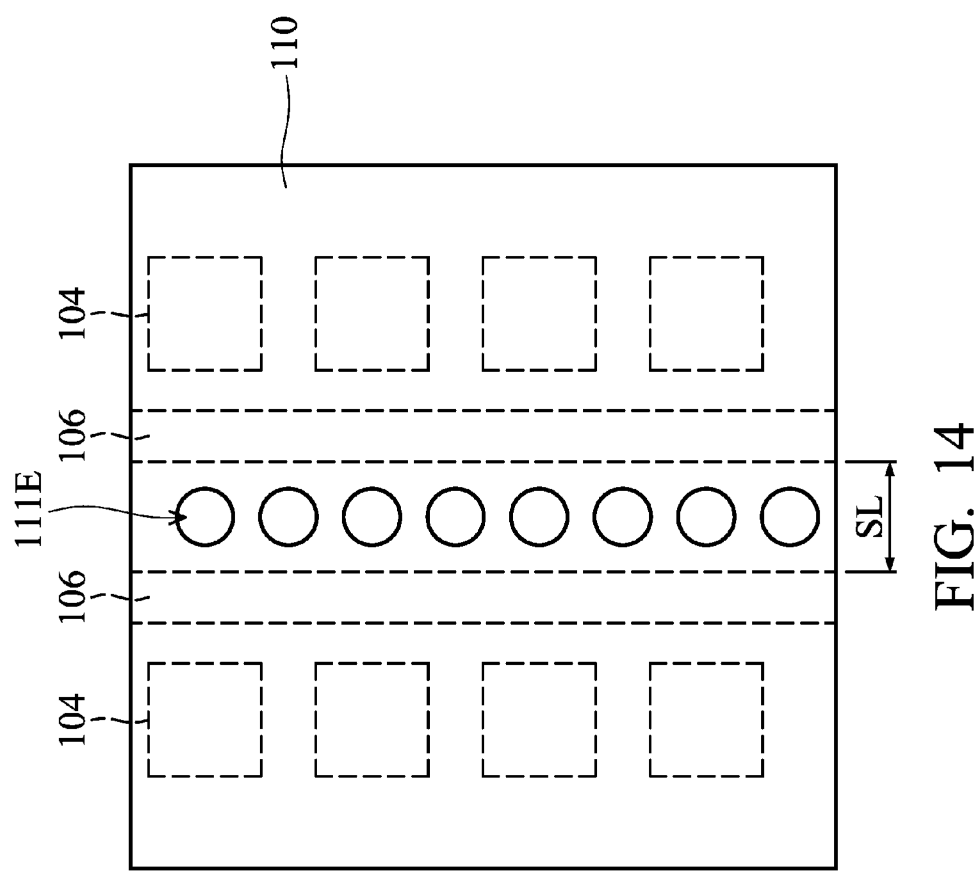

FIG. 13 shows an auxiliary pattern disposed on the scribe lines according to an embodiment of the present invention. According to the present invention, during the patterning process of FIG. 9, the hollow pattern 111E may be formed corresponding to the scribe lines SL, and the produced package layer is bonded to the semiconductor wafer 100 to form the structure as shown in FIG. 13. FIG. 14 shows a top view of the embodiment, wherein the hollow pattern 111E has a plurality of circular openings or openings in other shapes, such as a rectangular shape. The hollow pattern 111E on the scribe lines SL may decrease the force, required to achieve a hermetic package during the bonding process, and may provide extra space for the accommodation of the spare spacing material, if required, and may be removed completely during the cutting process.

Figure 15:
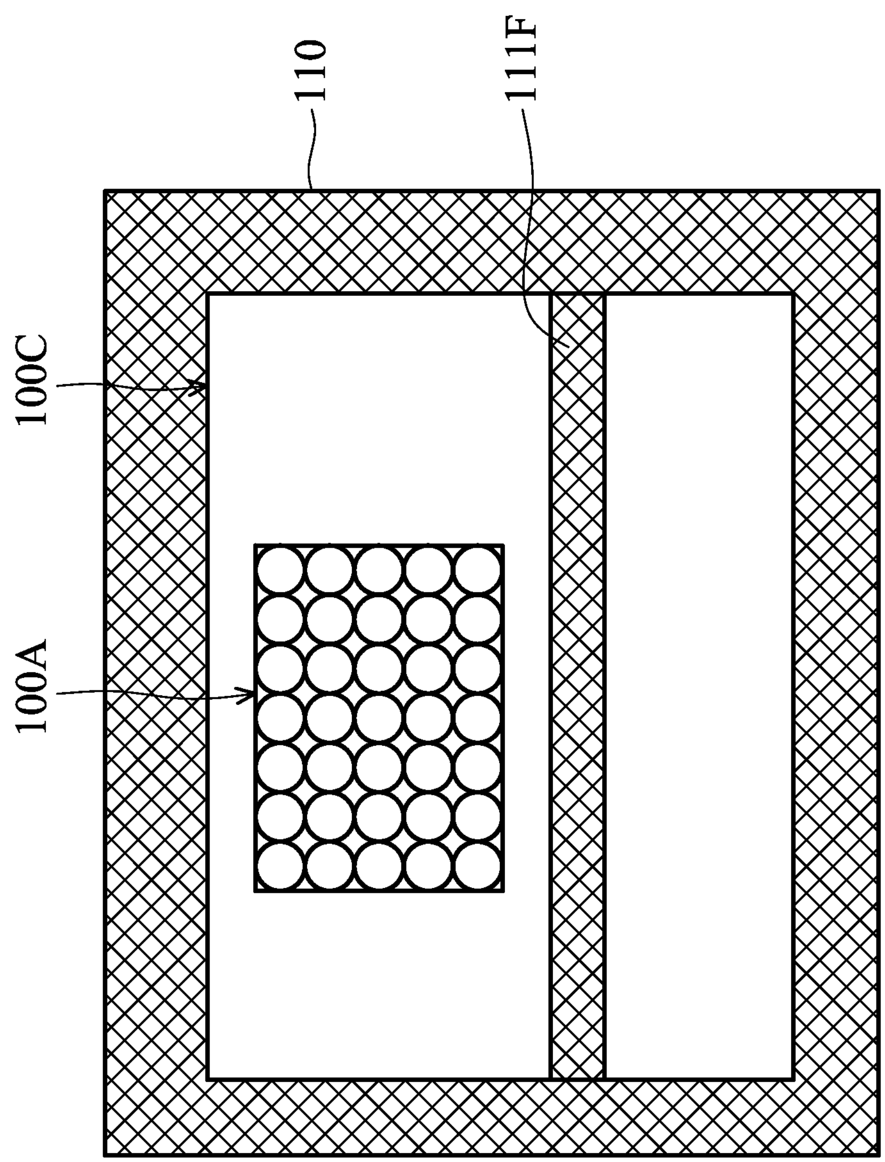
FIGS. 15-18 show chip packages having different material patterns according to further embodiments of the present invention.
Figure 16:
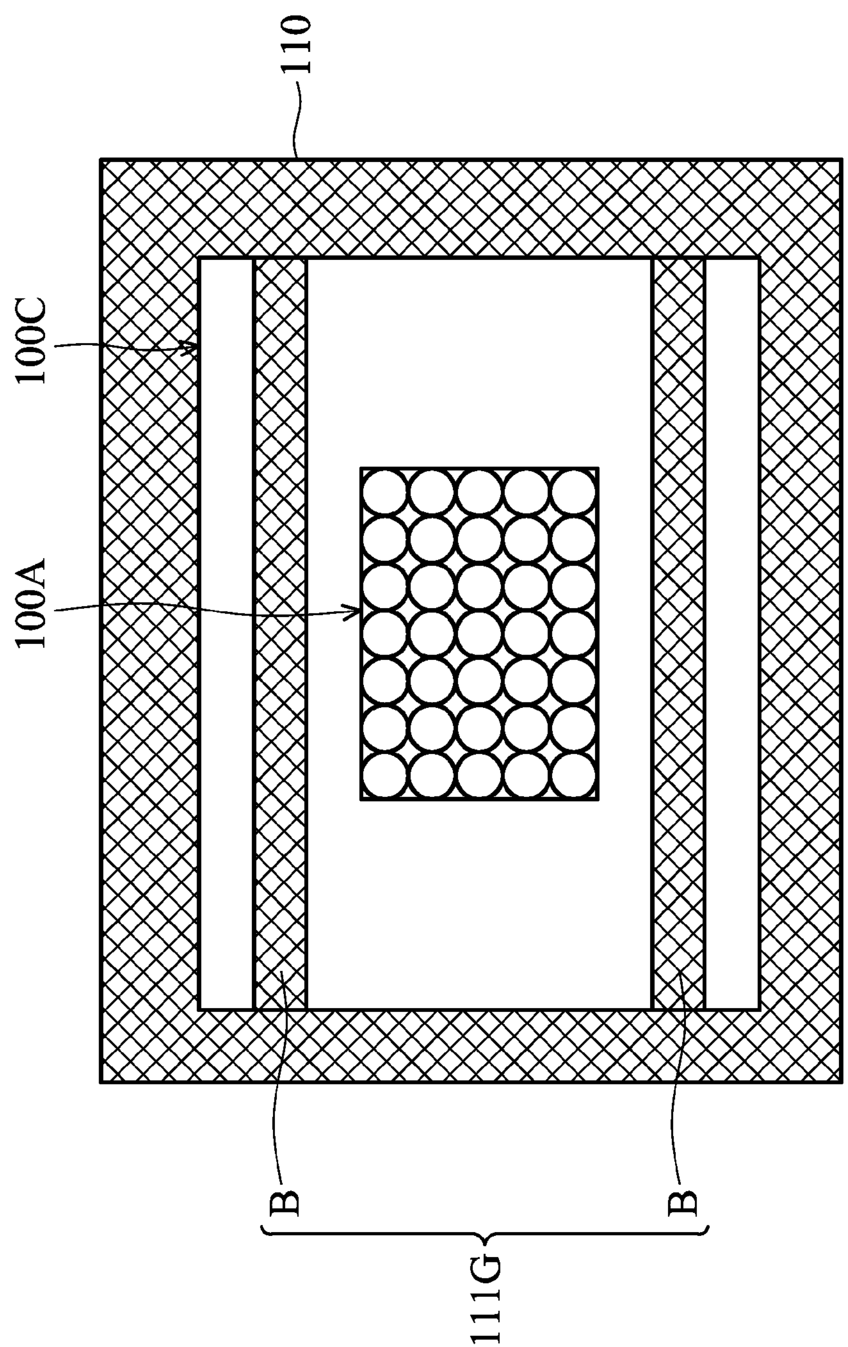
Figure 17:
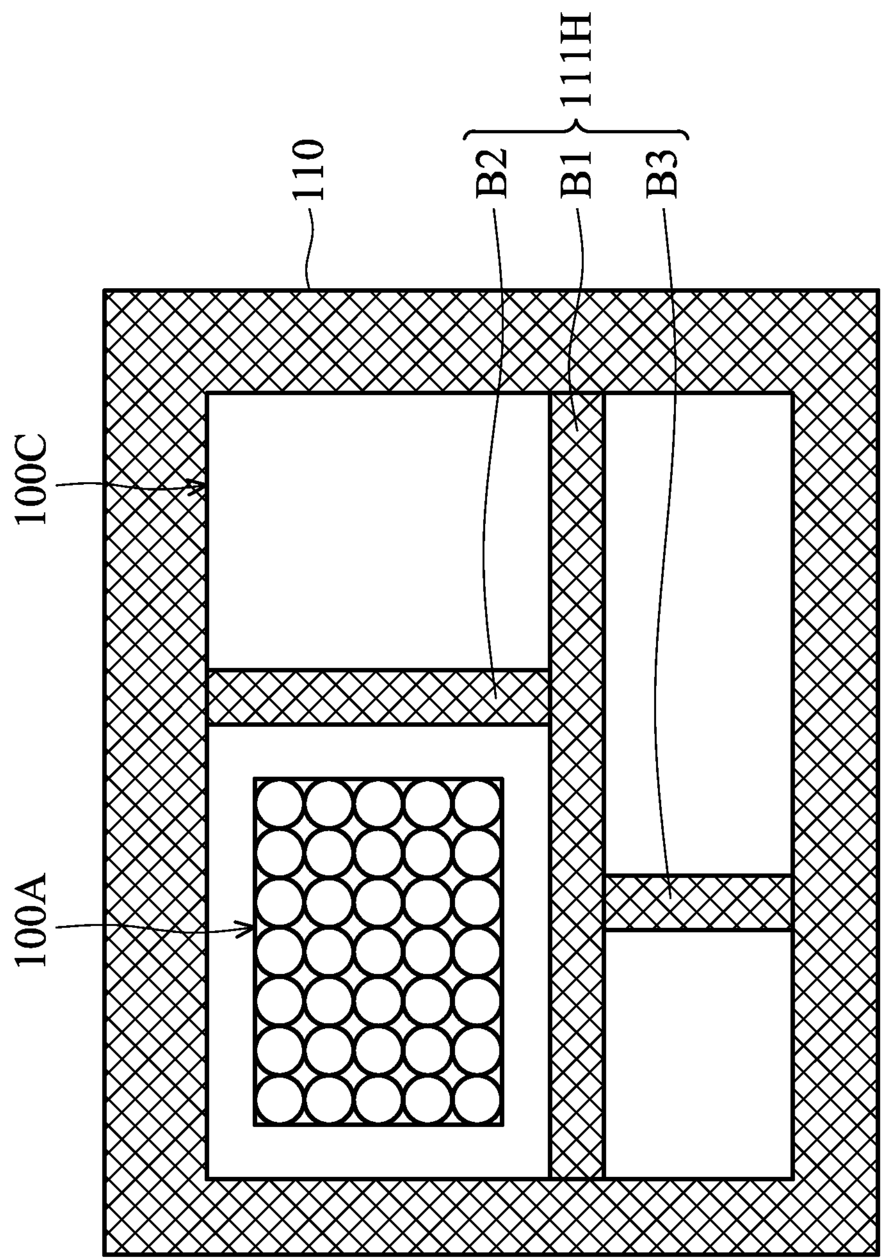
Figure 18:
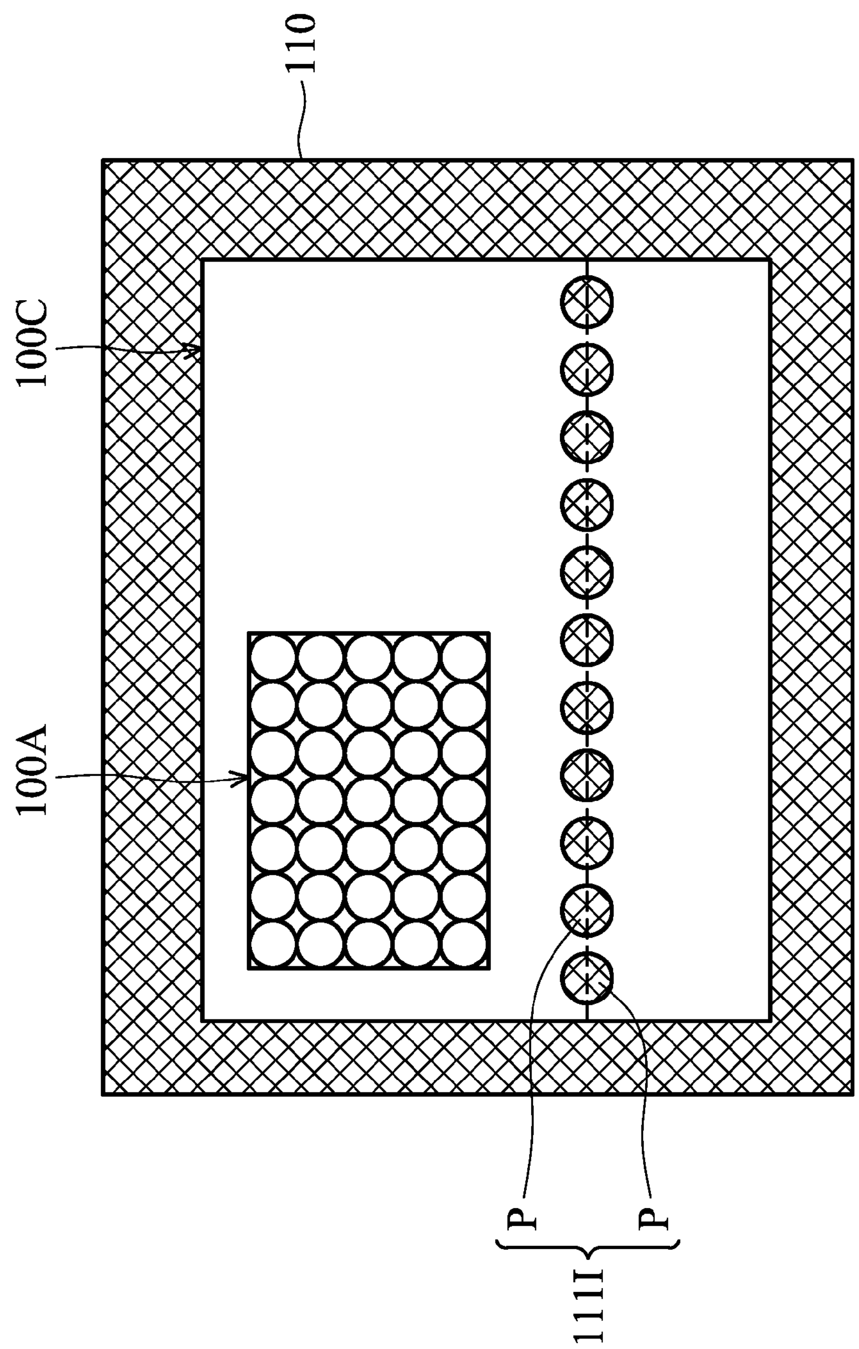

Also, the material patterns of embodiments of the present invention may have other variations. FIGS. 15-18 show chip packages having different material patterns of embodiments of the present invention. In FIG. 15, a material pattern 111F includes a bar pattern across a region 100C surrounded by the spacing layer 110. The device region 100A is located at one side of the material pattern 111F. In FIG. 16, a material pattern 111G includes two bar patterns B across the region 100C, wherein the two bar patterns B may be parallel or not parallel. In the embodiment, the device region 100A is located between the two bar patterns B. In other embodiments, the device region may be located at the same side of the two bar patterns B. In FIG. 17, a material pattern 111H includes three bar patterns B1, B2, B3 wherein the bar pattern B1 is across the region 100C, and the bar patterns B2, B3 connect the bar pattern B1 at one end and the spacing layer 110 at the other end. The bar patterns B2, B3 are at opposite sides of the bar pattern B1. In FIG. 18, a material pattern 111I includes a plurality of pillars P aligned along a line (such as the dotted line shown in the figure) across a region 100C surrounded by the spacing layer 110.

Figure 19A:
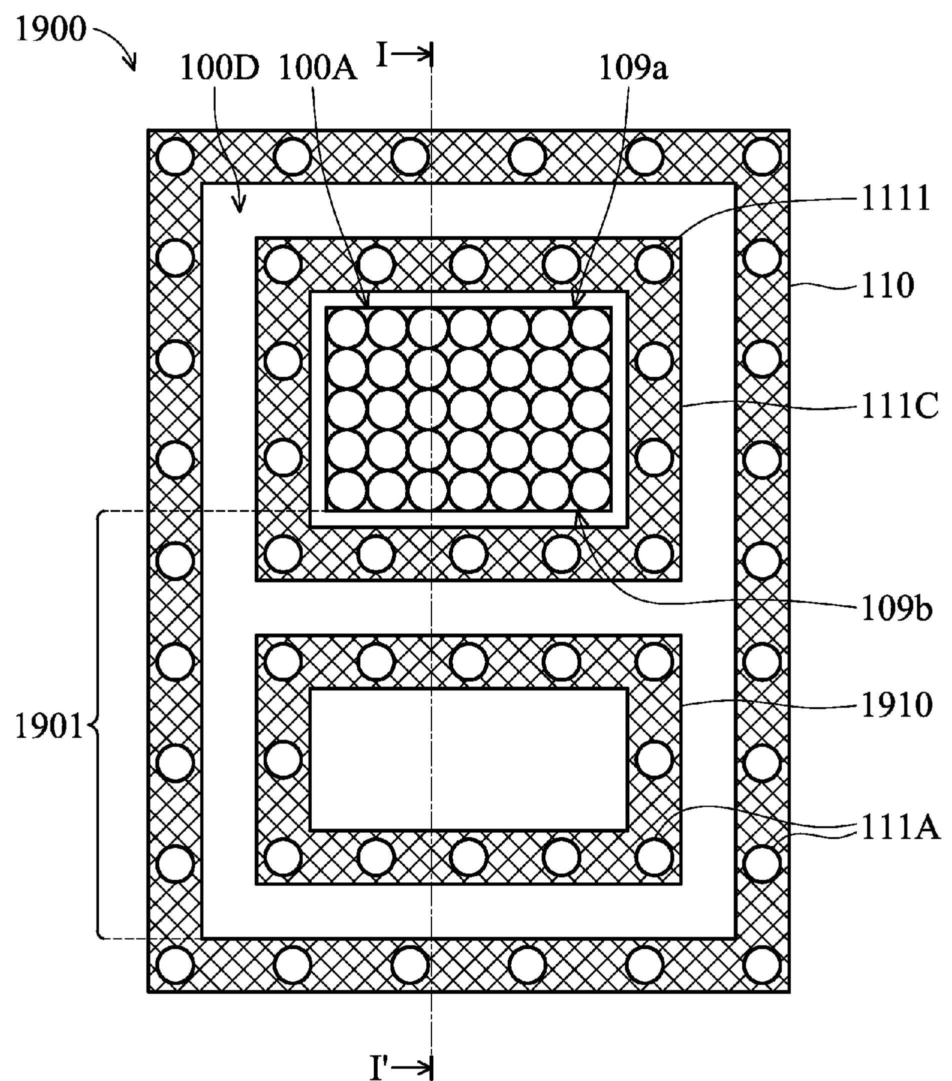
FIG. 19A shows a top view of a chip package of an embodiment of the present invention.
Figure 19B:
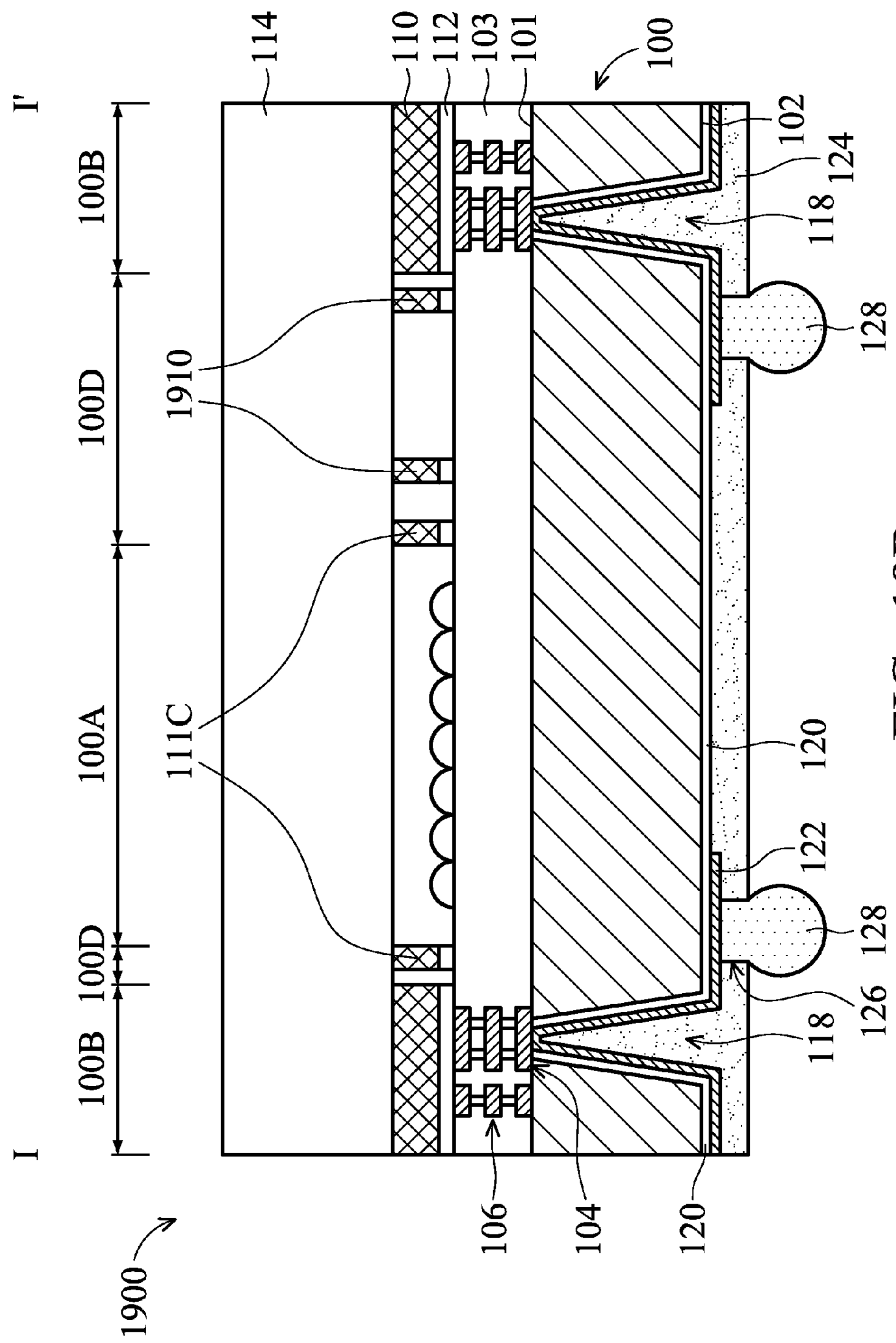
FIG. 19B shows a cross-sectional view of the chip package along a sectional line I-I' in FIG. 19A.

FIG. 19A shows a top view of a chip package of an embodiment of the present invention. FIG. 19B shows a cross-sectional view of the chip package along a sectional line I-I' in FIG. 19A. Referring to FIGS. 19A and 19B, the chip package 1900 of the embodiment is similar to the chip package 400 shown in FIG. 4, except that the chip package 1900 further has a ring structure 1910. Specifically, the semiconductor substrate 100 has a device region 100A, a non-device region 100D neighboring the device region, and a periphery bonding pad region 100B surrounding the device region 100A and the non-device region 100D. The spacing layer 110 surrounds the device region 100A and the non-device region 100D. The ring structure 1910 is disposed overlying the semiconductor substrate 100 and underlying the package layer 114, and is between the spacing layer 110 and the device region 100A, and surrounds a portion of the non-device region 100D.

The material pattern 111C is a continuous pattern surrounding the device region 100A, and the ring structure 1910 is disposed between the material pattern 111C and the spacing layer 110. The device region 100A has two opposite sides 109*a* and 109*b*, wherein the side 109*a* is closer to the spacing layer 110 than the side 109*b*. Thus, a larger cavity 1901 is provided between the side 109*b* of the device region 100A and the spacing layer 110. However, in the bonding process between the semiconductor substrate 100 and the package layer 114, portions of the semiconductor substrate 100 and the package layer 114 sandwiching the larger cavity 1901 are easily damaged, e.g. crushed, due to lack of support therebetween. In the present embodiment, the ring structure 1910 may provide mechanical support between the semiconductor substrate 100 and the package layer 114 to improve the reliability of the chip package 1900.

In one embodiment, a hollow pattern 111A may be optionally formed in the spacing layer 110 and/or the ring structure 1910, and the material pattern 111C may be a continuous pattern having a hollow structure 1111. The material of the ring structure 1910 may be a photosensitive insulating material, or the same material as the material pattern 111C or the spacing layer 110. The ring structure 1910 may be formed by photolithography.

Although the ring structure 1910 shown in FIG. 19A has a rectangular shape, it is not limited thereto. That is to say, the ring structure 1910 may have a circular shape, semi-circular shape, elliptical shape, triangular shape, square shape, polygonal shape, combinations thereof, or other suitable shape.

Figure 20:
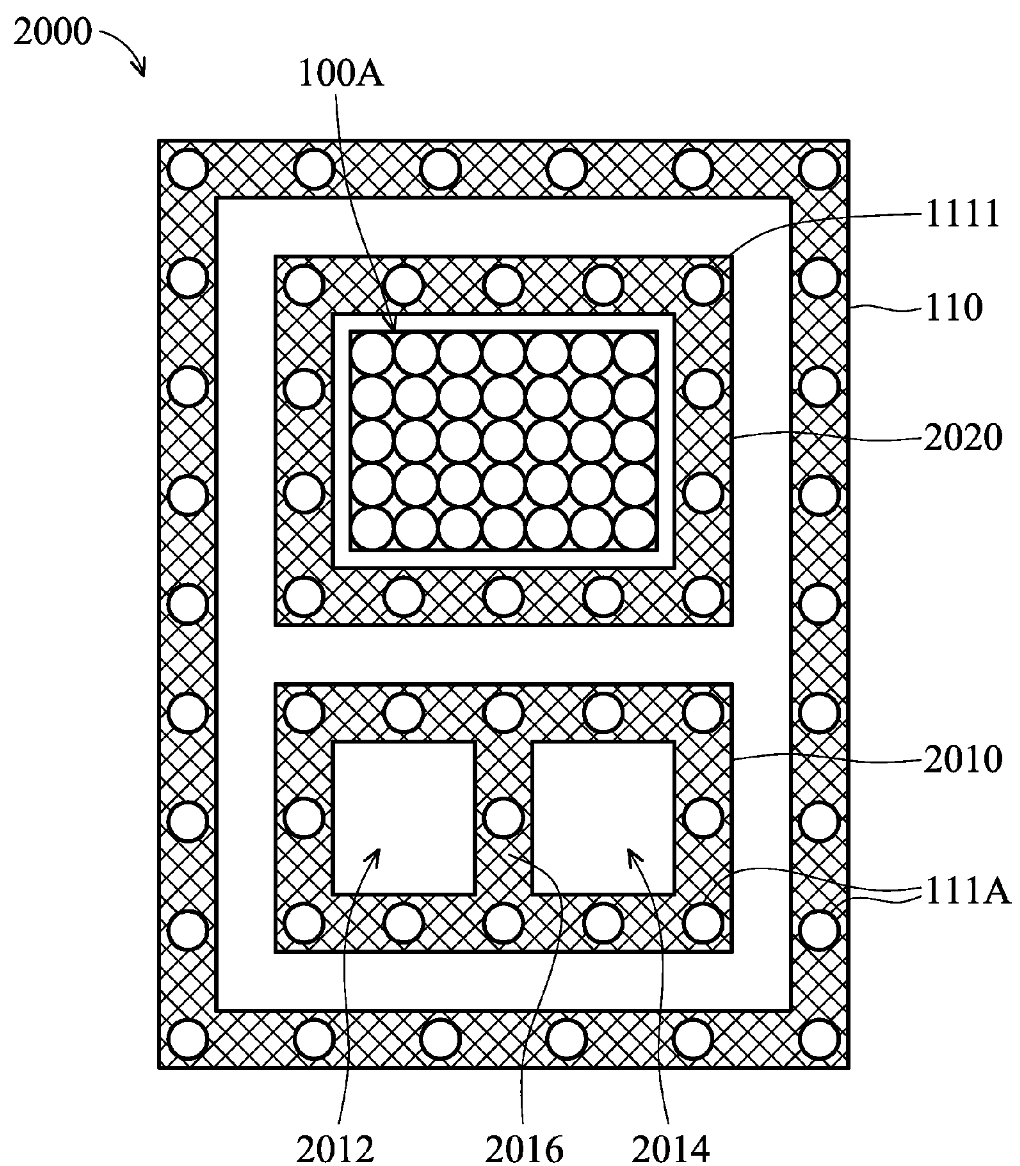
FIG. 20 shows a top view of a chip package of an embodiment of the present invention.

FIG. 20 shows a top view of a chip package of an embodiment of the present invention. Referring to FIG. 20, the chip package 2000 of the embodiment is similar to the chip package 1900 shown in FIG. 19A, except that the ring structure 2010 of the chip package 2000 has openings 2012 and 2014 separated from each other. Specifically, the ring structure 2010 further has a bar 2016 separating the openings 2012 and 2014.

In the present embodiment, the auxiliary pattern of the chip package 2000 may optionally include the hollow pattern 111A formed in the spacing layer 110 and the ring structure 2010, and a continuous pattern 2020 having a hollow structure 1111 surrounding the device region 100A. It should be noted that, in other embodiments, the hollow pattern 111A may be only formed in the spacing layer 110 or the ring structure 2010.

Figure 21:
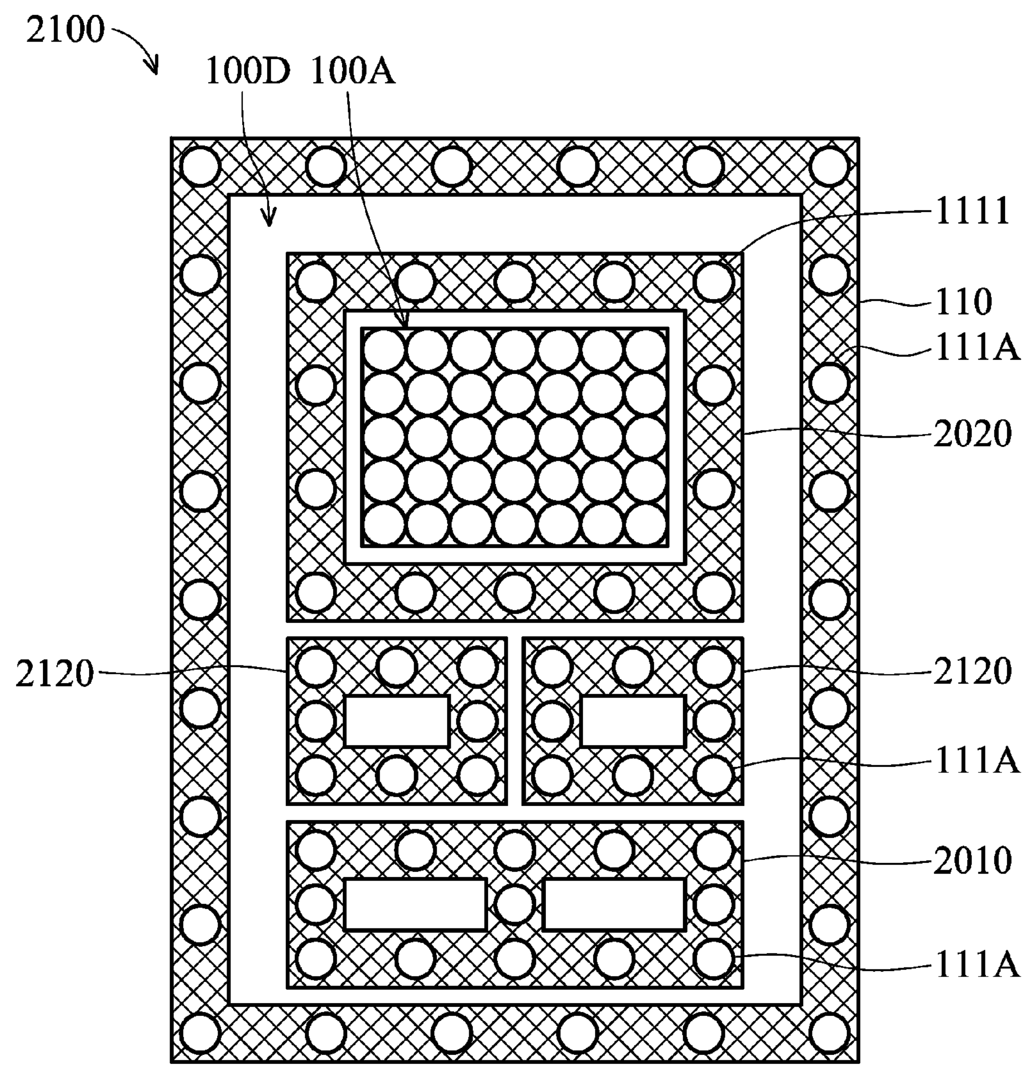
FIG. 21 shows a top view of a chip package of an embodiment of the present invention.

FIG. 21 shows a top view of a chip package of an embodiment of the present invention. Referring to FIG. 21, the chip package 2100 of the embodiment is similar to the chip package 2000 shown in FIG. 20, except that the chip package 2100 further has a plurality of ring structures 2120. Specifically, the ring structures 2120 are disposed overlying the semiconductor substrate 100 and underlying the package layer 114, and are between the spacing layer 110 and the device region 100A, and surround another portion of the non-device region 100D (referring to FIG. 19B). In the present embodiment, the ring structures 2120 are disposed between the device region 100A and the ring structure 2010. It will be appreciated, however, that the ring structures 2120 may be disposed in any place of the non-device region 100D.

In the present embodiment, the auxiliary pattern of the chip package 2100 may optionally include the hollow pattern 111A formed in the spacing layer 110, the ring structures 2010 and 2120, and a continuous pattern 2020 having a hollow structure 1111 surrounding the device region 100A. It should be noted that, in other embodiments, the hollow pattern 111A may be only formed in the spacing layer 110 (as shown in FIG. 24A), the ring structure 2010, or the ring structures 2120.

Figure 22:
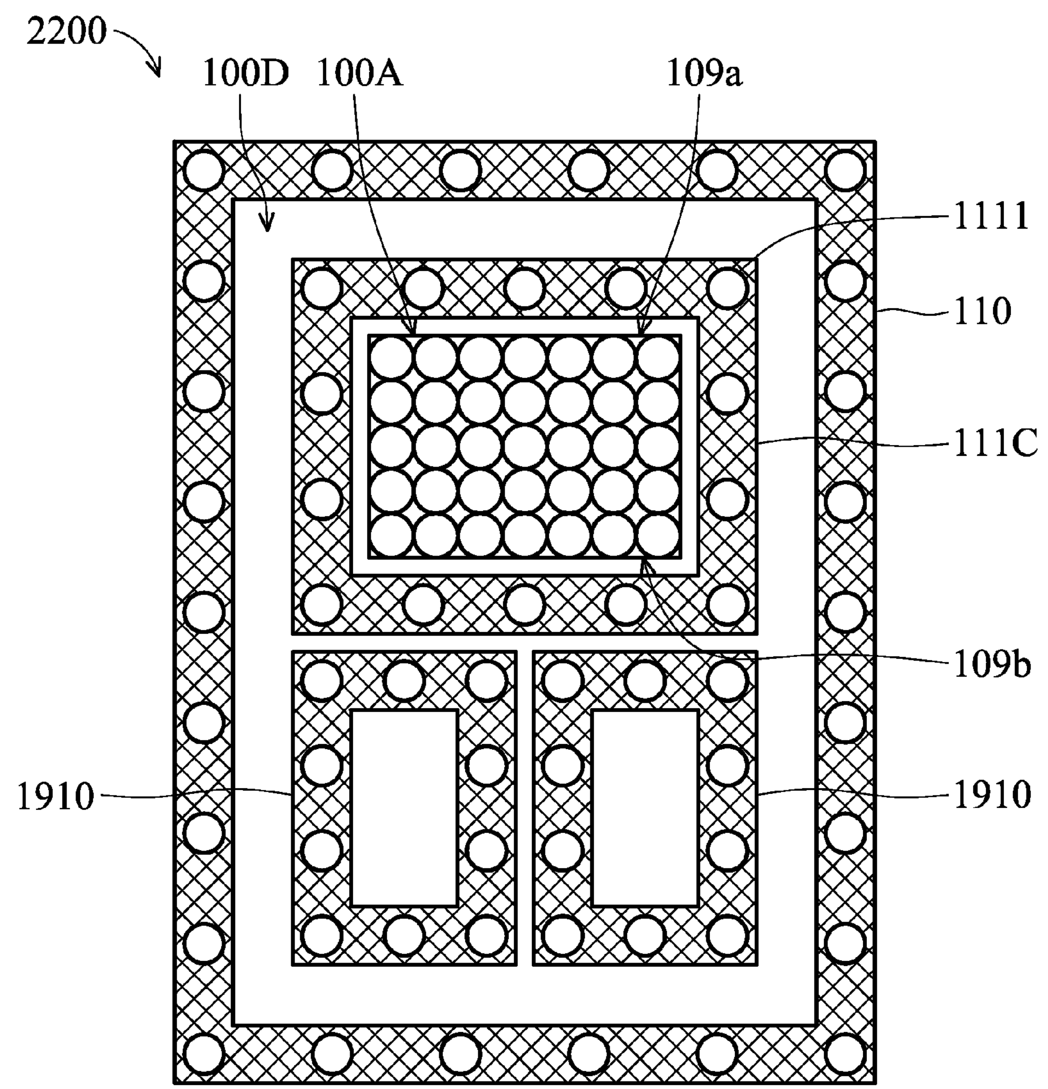
FIG. 22 shows a top view of a chip package of an embodiment of the present invention.

FIG. 22 shows a top view of a chip package of an embodiment of the present invention. Referring to FIG. 22, the chip package 2200 of the embodiment is similar to the chip package 1900 shown in FIG. 19A, except that the chip package 2200 has a plurality of ring structures 1910. Although FIG. 22 shows only two ring structures 1910 located at one side 109*b* of the device region 100A, the invention is not limited thereto. That is to say, two or more ring structures 1910 may be disposed in any place of the non-device region 100D as long as the ring structures 1910 can function as a mechanical support between the semiconductor substrate 100 and the package layer 114 (referring to FIG. 19B).

Figure 23:
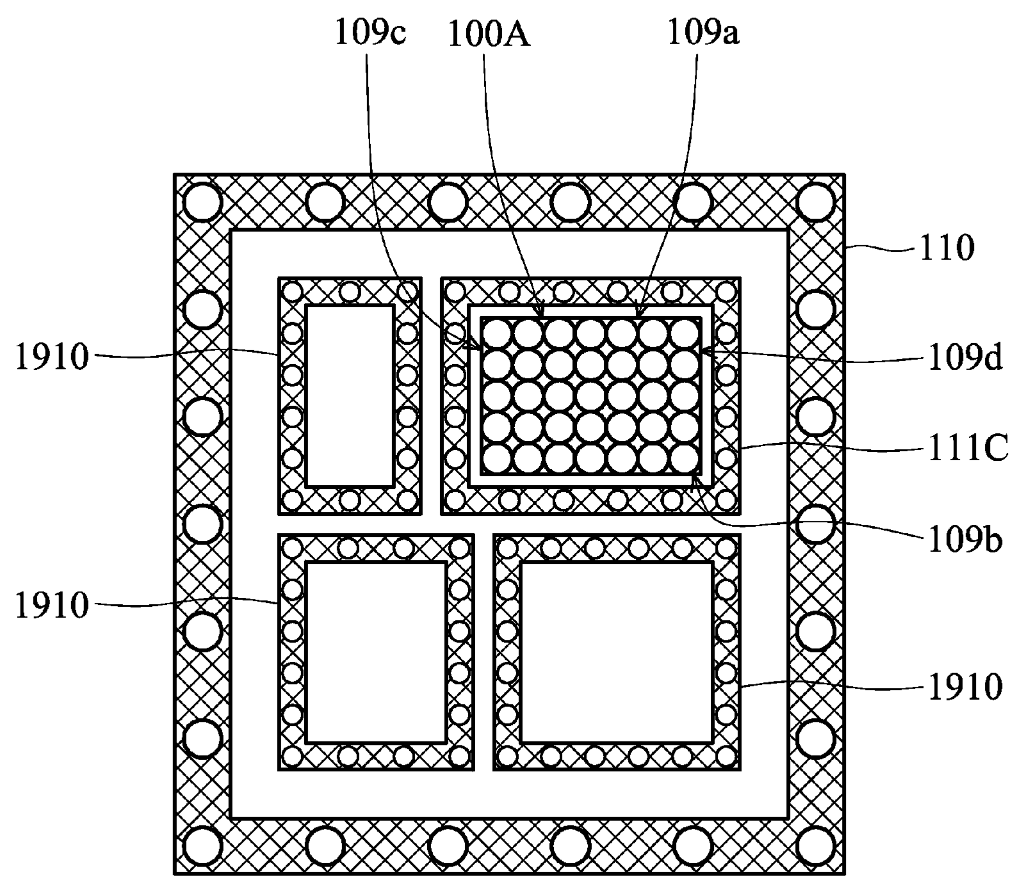
FIG. 23 shows a top view of a chip package of the other embodiment of the present invention.

FIG. 23 shows a top view of a chip package of the other embodiment of the present invention. Referring to FIG. 23, in the other embodiment, the ring structures 1910 are arranged at two sides 109*b* and 109*c* of the device region 100A. In another embodiment, the ring structures 1910 may be arranged at three sides 109*b*, 109*c*, and 109*a* or four sides 109*a*, 109*b*, 109*c*, and 109*d* of the device region 100A.

Figure 24A:
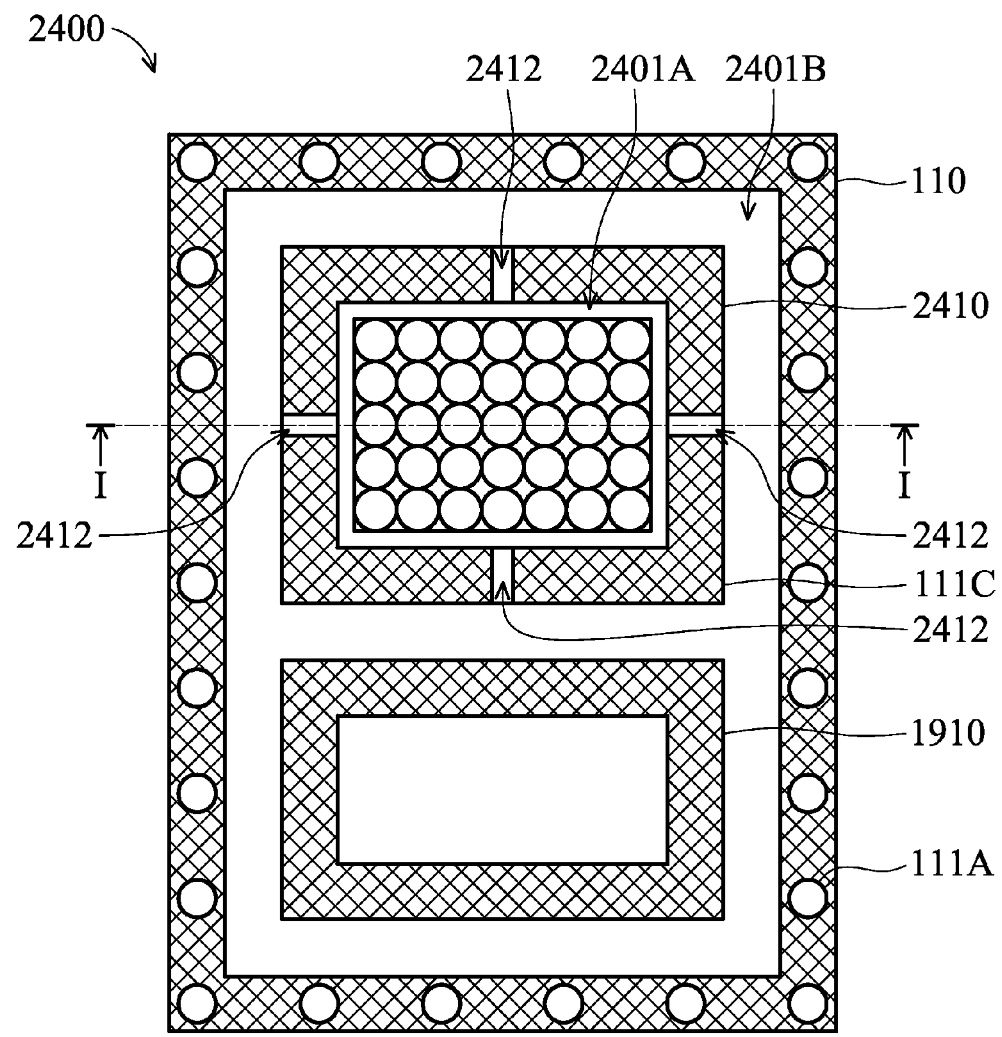
FIG. 24A shows a top view of a chip package of an embodiment of the present invention.
Figure 24B:
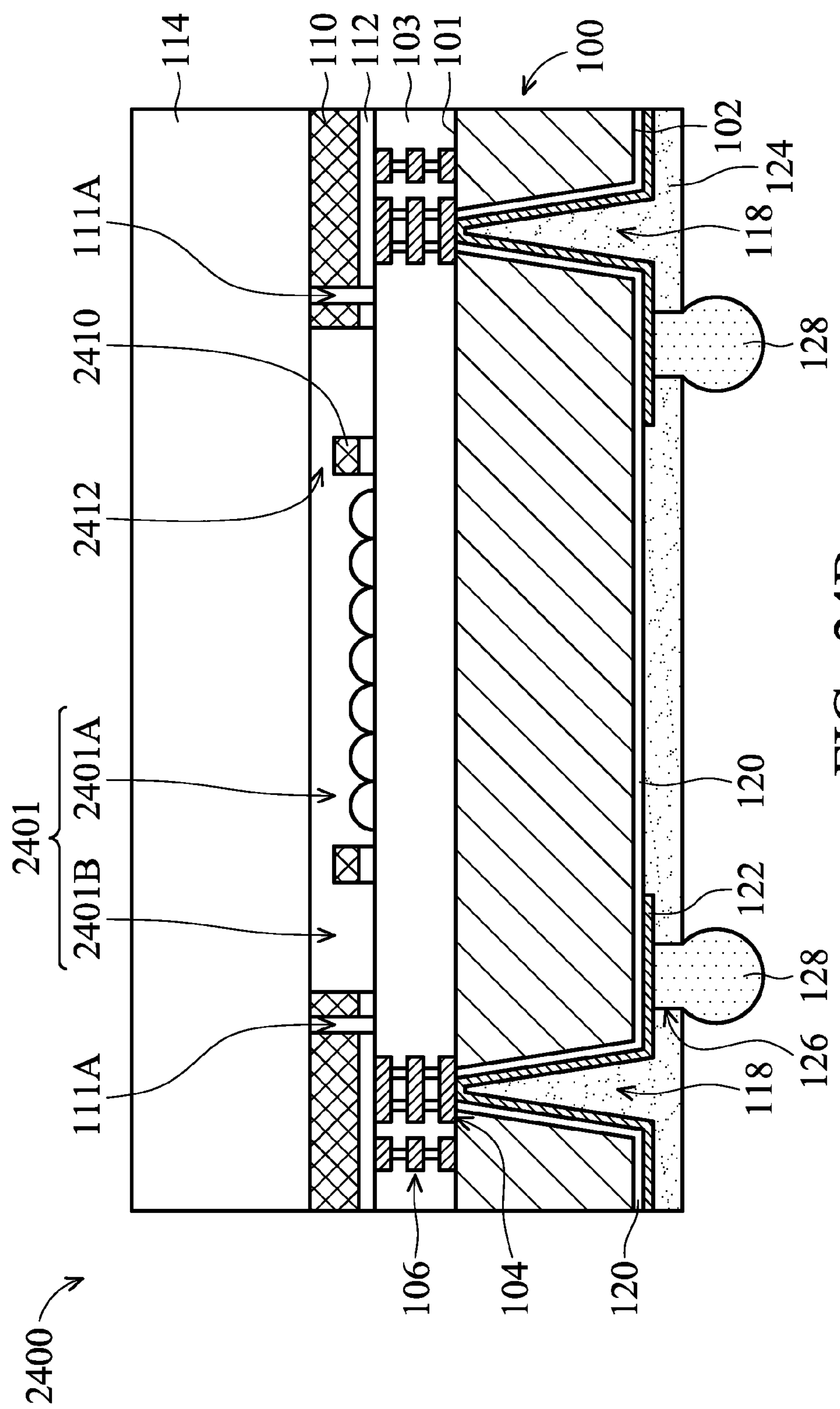
FIG. 24B shows a cross-sectional view of the chip package along a sectional line I-I in FIG. 24A.

FIG. 24A shows a top view of a chip package of an embodiment of the present invention. FIG. 24B shows a cross-sectional view of the chip package along a sectional line I-I in FIG. 24A. Referring to FIGS. 24A and 24B, the chip package 2400 of the embodiment is similar to the chip package 1900 shown in FIGS. 19A and 19B, except that the continuous pattern 2410 of the chip package 2400 further has a plurality of channels 2412.

Specifically, a cavity 2401 is provided between the semiconductor substrate 100, the package layer 114, and the spacing layer 110. The continuous pattern 2410 divides the cavity 2401 into chambers 2401A and 2401B and surrounds the chamber 2401A, wherein the channels 2412 connect the chambers 2401A and 2401B. Although the continuous pattern 2410 has a plurality of channels 2412 in the present embodiment, the invention is not limited thereto. For example, in other embodiments, the continuous pattern 2410 may have only one channel 2412. In addition, the channels 2412 are shown as being adjacent to the package layer 114; however they may be adjacent to the semiconductor substrate 100.

It should be noted that, if the pressure inside the chambers 2401A is too high, the continuous pattern 2410 may burst due to the high pressure. The channels 2412 of the present embodiment may help to release the pressure inside the chambers 2401A, so as to improve the reliability of the chip package 2400.

Figure 25A:
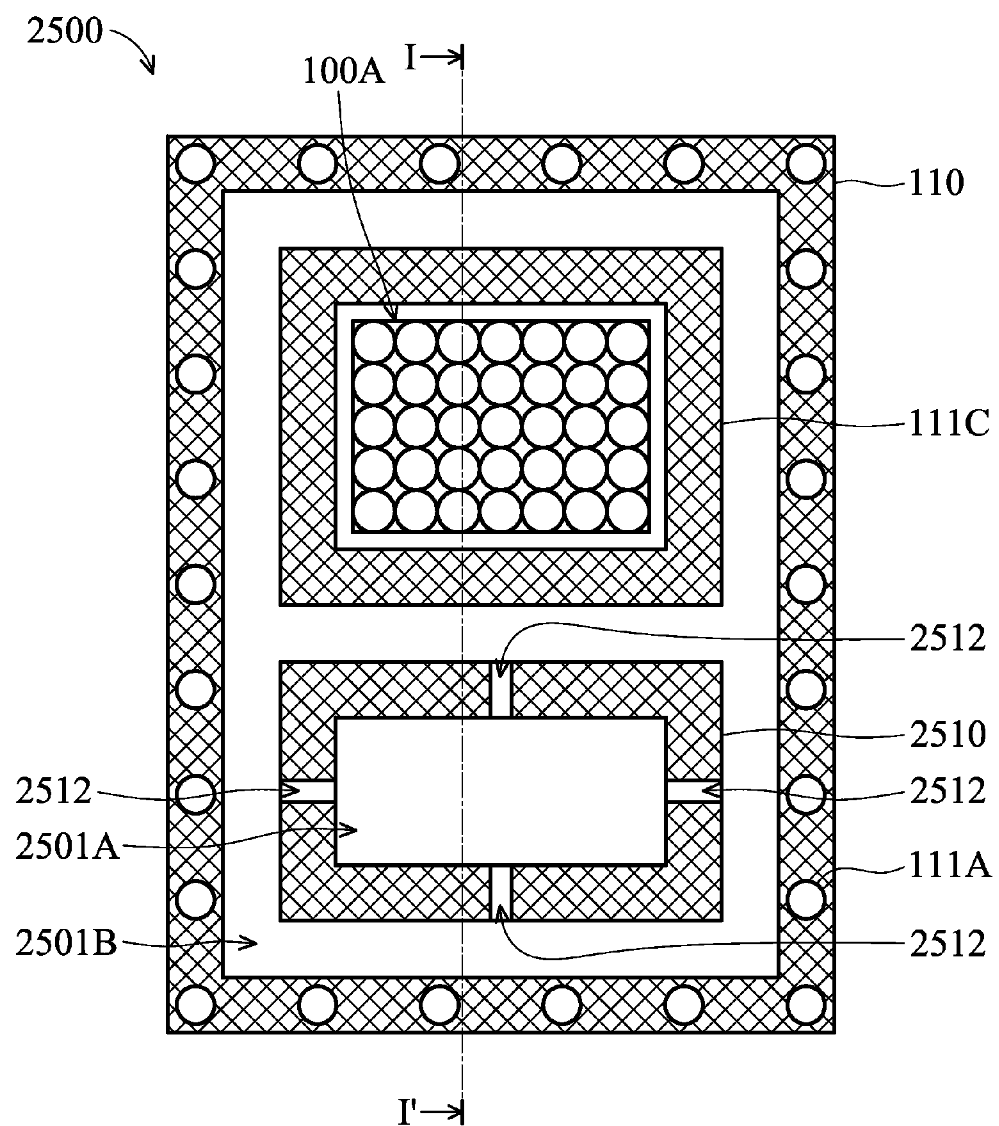
FIG. 25A shows a top view of a chip package of an embodiment of the present invention.
Figure 25B:
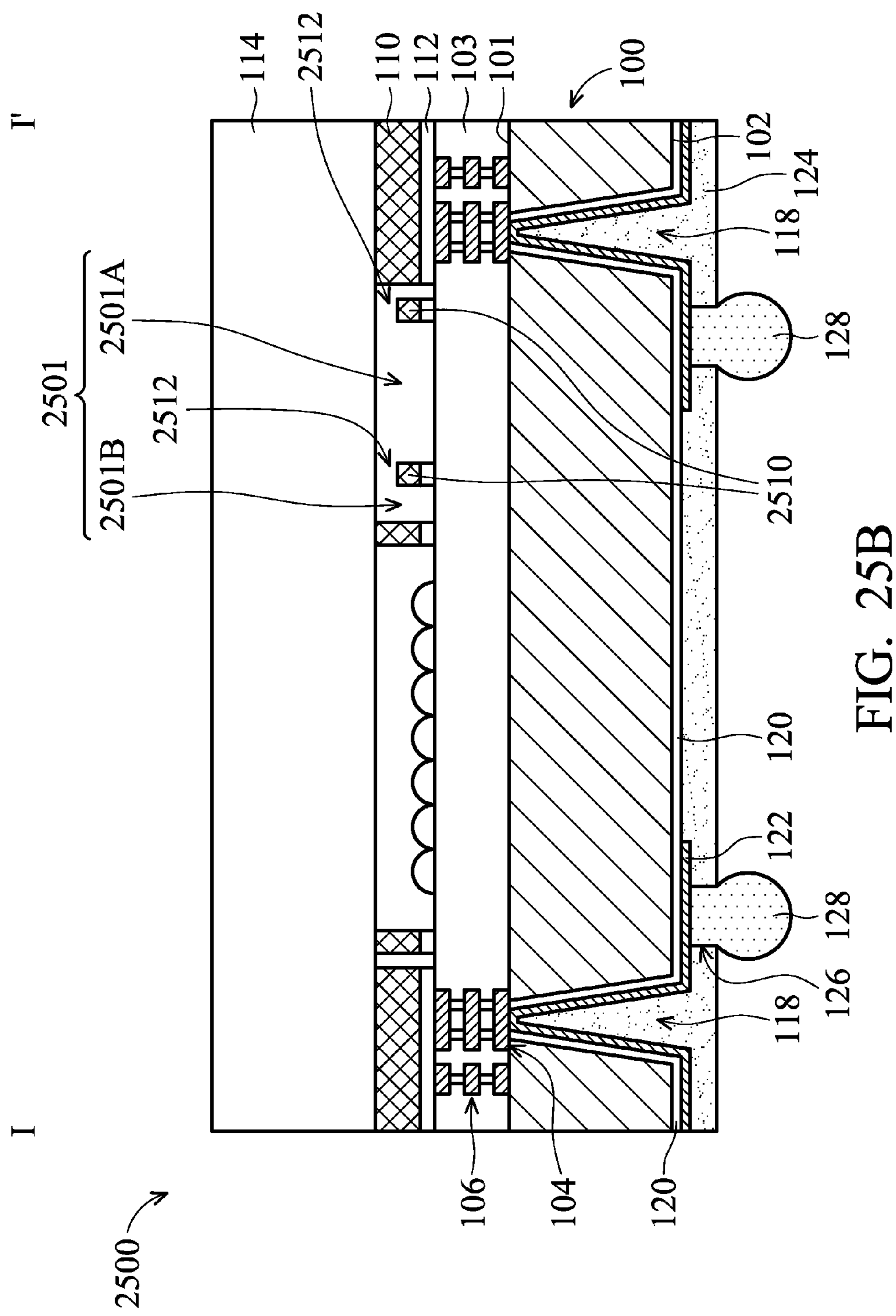
FIG. 25B shows a cross-sectional view of the chip package along a sectional line I-I' in FIG. 25A.

FIG. 25A shows a top view of a chip package of an embodiment of the present invention. FIG. 25B shows a cross-sectional view of the chip package along a sectional line I-I' in FIG. 25A. Referring to FIGS. 25A and 25B, in the present embodiment, the chip package 2500 of the embodiment is similar to the chip package 1900 shown in FIGS. 19A and 19B, except that the ring structure 2510 of the chip package 2500 further has a plurality of channels 2512.

Specifically, a cavity 2501 is provided between the semiconductor substrate 100, the package layer 114, and the spacing layer 110. The ring structure 2510 divides the cavity 2501 into chambers 2501A and 2501B and surrounds the chamber 2501A, wherein the channels 2512 connect the chambers 2501A and 2501B. The amount and the location of the channels 2512 may be adjusted according to the particular requirements.

Figure 26A:
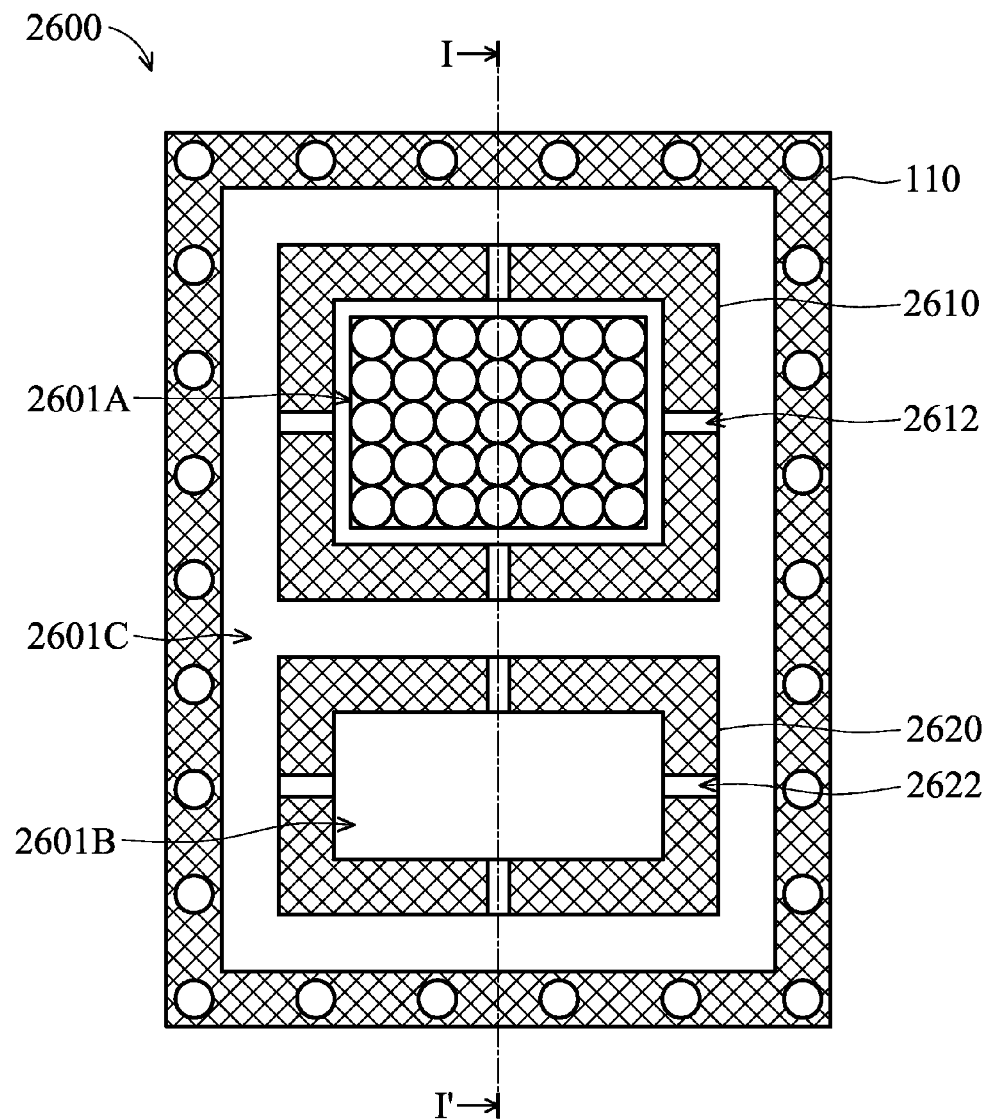
FIG. 26A shows a top view of a chip package of an embodiment of the present invention.
Figure 26B:
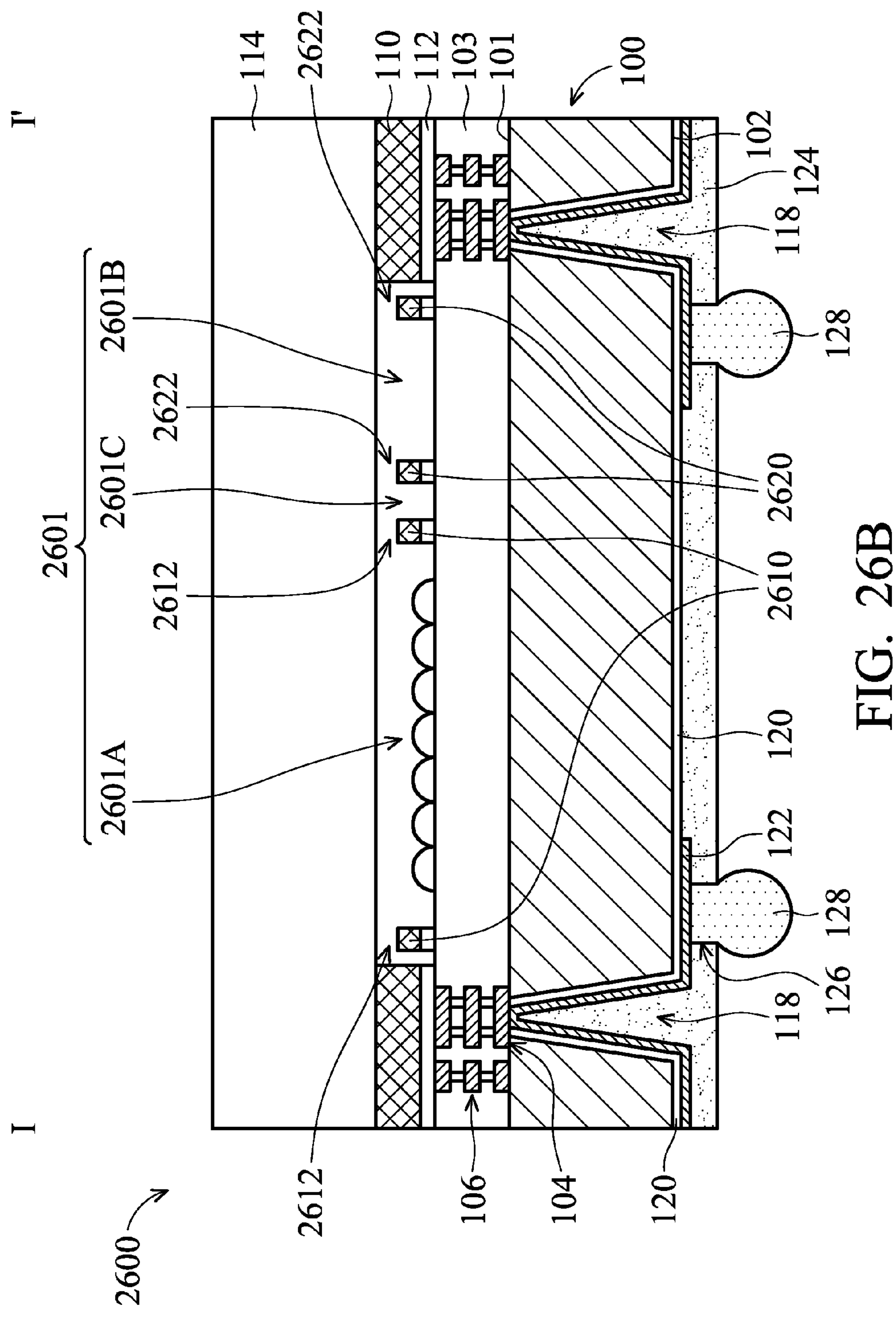
FIG. 26B shows a cross-sectional view of the chip package along a sectional line I-I' in FIG. 26A.

FIG. 26A shows a top view of a chip package of an embodiment of the present invention. FIG. 26B shows a cross-sectional view of the chip package along a sectional line I-I' in FIG. 26A. Referring to FIGS. 26A and 26B, in the present embodiment, the chip package 2600 of the embodiment is similar to the chip package 1900 shown in FIGS. 19A and 19B, except that the continuous pattern 2610 of the chip package 2600 further has a plurality of channels 2612, and the ring structure 2620 of the chip package 2600 further has a plurality of channels 2622.

Specifically, a cavity 2601 is provided between the semiconductor substrate 100, and the package layer 114, wherein the continuous pattern 2610 and the ring structure 2620 divide the cavity 2601 into a chamber 2601A surrounded by the continuous pattern 2610, a chamber 2601B surrounded by the ring structure 2620, and a chamber 2601C between any two of the continuous pattern 2610, the ring structure 2620 and the spacing layer 110. The channels 2612 connect the chambers 2601A and 2601C, and the channels 2622 connect the chambers 2601B and 2601C. The amount and the location of the channels 2612 and 2622 may be adjusted according to the particular requirements.

In view of the above, the embodiments of the present invention provide at least the following advantages by using the auxiliary pattern:

1. The hollow pattern may help release the stress between the spacing layer and the substrate/the package layer so as to improve the reliability of chip packages.

2. The material pattern may provide an additional supporting force to achieve a wafer-level package of large-sized chips and decrease the thickness of the wafer.

3. The material pattern between the device region and the spacing layer may serve as a masking layer to reduce the noise of image sensor devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:

a semiconductor substrate having a device region and a non-device region neighboring the device region;

a package layer disposed on the semiconductor substrate;

a spacing layer disposed between the semiconductor substrate and the package layer and surrounding the device region and the non-device region;

a ring structure disposed overlying the semiconductor substrate and underlying the package layer, and between the spacing layer and the device region, and surrounding a portion of the non-device region and not surrounding the device region; and an auxiliary pattern comprising a hollow pattern formed in the spacing layer or the ring structure, a material pattern located between the spacing layer and the device region, or combinations thereof.

2. The chip package as claimed in claim 1, wherein the ring structure has two openings separated from each other.

3. The chip package as claimed in claim 1, further comprising:

at least one second ring structure disposed overlying the semiconductor substrate and underlying the package layer, and between the spacing layer and the device region, and surrounding another portion of the non-device region.

4. The chip package as claimed in claim 1, wherein the hollow pattern has a circular shape, semi-circular shape, elliptical shape, triangular shape, square shape, rectangular shape, polygonal shape, or combinations thereof.

5. The chip package as claimed in claim 1, wherein the material pattern has a circular shape, semi-circular shape, elliptical shape, triangular shape, square shape, rectangular shape, polygonal shape, or combinations thereof.

6. The chip package as claimed in claim 1, wherein the material pattern comprises a plurality of pillars separated from each other, a continuous pattern surrounding the device region, or a continuous pattern having a hollow structure.

7. The chip package as claimed in claim 6, wherein a cavity is provided between the semiconductor substrate, the package layer, and the spacing layer, wherein the continuous pattern divides the cavity into a first chamber and a second chamber and surrounds the first chamber, and the continuous pattern has at least one channel connecting the first chamber and the second chamber.

8. The chip package as claimed in claim 7, wherein the channel is adjacent to the package layer.

9. The chip package as claimed in claim 7, wherein the channel is adjacent to the semiconductor substrate.

10. The chip package as claimed in claim 6, wherein a cavity is provided between the semiconductor substrate, the package layer, and the spacing layer, wherein the continuous pattern and the ring structure divide the cavity into a first chamber surrounded by the continuous pattern, a second chamber surrounded by the ring structure, and a third chamber between any two of the continuous pattern, the ring structure and the spacing layer, and the continuous pattern has at least one first channel connecting the first chamber and the third chamber, and the ring structure has at least one second channel connecting the second chamber and the third chamber.

11. The chip package as claimed in claim 1, wherein a cavity is provided between the semiconductor substrate, the package layer, and the spacing layer, wherein the ring structure divides the cavity into a third chamber and a fourth chamber and surrounds the third chamber, and the ring structure has at least one channel connecting the third chamber and the fourth chamber.

12. The chip package as claimed in claim 1, wherein a pattern density of the material pattern is asymmetric with respect to the device region.

13. The chip package as claimed in claim 1, further comprising an adhesive layer disposed between the spacing layer and the semiconductor substrate or between the spacing layer and the package layer, wherein at least a portion of the adhesive layer is filled in the hollow pattern.

14. The chip package as claimed in claim 1, wherein the spacing layer comprises a photosensitive insulating material.

15. The chip package as claimed in claim 1, wherein the spacing layer and the auxiliary pattern are formed of the same material.

16. The chip package as claimed in claim 1, wherein the semiconductor substrate further comprises:

a periphery bonding pad region surrounding the device region; and conductive pads disposed in the periphery bonding pad region.

17. The chip package as claimed in claim 16, further comprising:

a through hole located on a surface of the semiconductor substrate and exposing the conductive pads;

an insulating layer disposed on the surface of the semiconductor substrate and extending into a sidewall of the through hole;

a conductive trace layer disposed on the insulating layer and extending into a bottom of the through hole to electrically connect to the conductive pads;

a passivation layer covering the conductive trace layer and the insulating layer and having an opening exposing the conductive trace layer; and a conductive bump disposed in the opening of the passivation layer and electrically connecting to the conductive trace layer.

18. The chip package as claimed in claim 1, wherein the material pattern comprises at least one bar pattern across a region surrounded by the spacing layer.

19. The chip package as claimed in claim 1, wherein the material pattern comprises a plurality of pillars aligned along a line across a region surrounded by the spacing layer.

20. The chip package as claimed in claim 1, wherein the ring structure has a circular shape, semi-circular shape, elliptical shape, triangular shape, square shape, rectangular shape, polygonal shape, or combinations thereof.

* * * * *